US012615817B2

(12) United States Patent
Xie et al.

(10) Patent No.: US 12,615,817 B2
(45) Date of Patent: Apr. 28, 2026

(54) STACKED FET WITH LOW PARASITIC-CAPACITANCE GATE

(71) Applicant: International Business Machines Corporation, Armonk, NY (US)

(72) Inventors: Ruilong Xie, Niskayuna, NY (US); Brent A. Anderson, Jericho, VT (US); Junli Wang, Slingerlands, NY (US); Jay William Strane, Wappinger Falls, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 401 days.

(21) Appl. No.: 18/214,642

(22) Filed: Jun. 27, 2023

(65) Prior Publication Data
US 2025/0006786 A1 Jan. 2, 2025

(51) Int. Cl.
*H01L 29/06* (2006.01)
*H01L 27/088* (2006.01)
(Continued)

(52) U.S. Cl.
CPC ......... *H10D 62/121* (2025.01); *H10D 30/014* (2025.01); *H10D 30/43* (2025.01);
(Continued)

(58) Field of Classification Search
CPC .... H10D 30/014; H10D 30/024; H10D 30/43; H10D 30/62; H10D 30/6211; H10D 30/6212; H10D 30/6213; H10D 30/6735; H10D 30/6757; H10D 62/115; H10D 62/118; H10D 62/119; H10D 62/121;

H10D 64/015; H10D 64/018; H10D 64/021; H10D 84/0158; H10D 84/0193; H10D 84/83; H10D 84/834; H10D 84/853
See application file for complete search history.

(56) References Cited

U.S. PATENT DOCUMENTS 9,224,811 B2 12/2015 Cheng
9,659,963 B2 5/2017 Cheng
(Continued)

FOREIGN PATENT DOCUMENTS

EP 2519975 B1 5/2018
EP 4089722 A1 11/2022

OTHER PUBLICATIONS

Lacord, J. et al, "Comprehensive and Accurate Parasitic Capacitance Models for Two- and Three-Dimensional CMOS Device Structures," in IEEE Transactions on Electron Devices, vol. 59, No. 5, pp. 1332-1344, May 2012, doi: 10.1109/TED.2012.2187454.
(Continued)

*Primary Examiner* — David C Spalla
(74) *Attorney, Agent, or Firm* — Samuel A. Waldbaum

(57) ABSTRACT
A semiconductor device comprises a top field effect transistor (FET) and a bottom FET in a stacked profile. The semiconductor device also comprises a gate. The gate comprises two top-FET gate extensions and two bottom-FET gate extensions. The semiconductor device also comprises an insulator liner. The insulator liner interfaces with the two top-FET gate extensions and two bottom-FET gate extensions. The semiconductor device also comprises a dielectric that interfaces with the insulator liner.

17 Claims, 20 Drawing Sheets

(51) Int. Cl.

| | |
|---|---|
| *H01L 29/423* | (2006.01) |
| *H01L 29/66* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/83* | (2025.01) |

(52) U.S. Cl.
CPC ..... *H10D 30/6735* (2025.01); *H10D 30/6757* (2025.01); *H10D 62/115* (2025.01); *H10D 64/017* (2025.01); *H10D 64/021* (2025.01); *H10D 84/83* (2025.01)

(56) References Cited

U.S. PATENT DOCUMENTS

| | | |
|---|---|---|
| 9,837,414 B1 | 12/2017 | Balakrishnan |
| 9,997,598 B2 | 6/2018 | Smith |
| 10,192,867 B1 | 1/2019 | Frougier |
| 10,283,621 B2 | 5/2019 | Xie |
| 10,461,186 B1 | 10/2019 | Zhang |
| 10,658,462 B2 | 5/2020 | Lee |
| 10,679,894 B2 | 6/2020 | Frougier et al. |
| 10,714,391 B2 | 7/2020 | Smith |
| 10,748,994 B2 | 8/2020 | Reznicek |
| 10,811,415 B2 | 10/2020 | Sengupta |
| 10,833,078 B2 | 11/2020 | Smith et al. |
| 10,879,352 B2 | 12/2020 | Zhang |
| 11,121,044 B2 | 9/2021 | Cheng |
| 11,158,544 B2 | 10/2021 | Cheng |
| 11,239,232 B2 | 2/2022 | Lilak |
| 11,367,722 B2 | 6/2022 | Lilak |
| 11,502,167 B2 | 11/2022 | Hong |
| 12,356,665 B2 | 7/2025 | Yun et al. |
| 2021/0028169 A1 | 1/2021 | Smith et al. |
| 2021/0313231 A1 | 10/2021 | Thompson |
| 2021/0407999 A1 | 12/2021 | Huang |
| 2022/0301936 A1 | 9/2022 | Merchant |
| 2022/0352181 A1 | 11/2022 | Yang |
| 2022/0367520 A1 | 11/2022 | Hong et al. |
| 2022/0367658 A1 | 11/2022 | Yim |
| 2023/0086084 A1 | 3/2023 | Yun et al. |
| 2023/0125316 A1* | 4/2023 | Xie .................... H10D 84/0172 257/351 |
| 2023/0178593 A1* | 6/2023 | Yeh ................... H01L 21/02332 257/347 |
| 2023/0307456 A1* | 9/2023 | Lin ........................ H10D 88/00 |
| 2023/0343823 A1* | 10/2023 | Baek ..................... H10D 30/43 |

OTHER PUBLICATIONS

List of IBM Patents or Patent Applications to be Treated as Related, Dated Jun. 26, 2023, 2 pgs.

Song, T, "Many-Tier Vertical GAAFET (V-FET) for Ultra-Miniaturized Standard Cell Designs Beyond 5 nm," in IEEE Access, vol. 8, pp. 149984-149998, 2020, doi: 10.1109/ACCESS.2020.3015596.

Senapati et al., "Stacked Nanosheet FETS With Gate Dielectric Fill," U.S. Appl. No. 18/214,682, filed Jun. 27, 2023.

Xie et al., "Stacked Field-Effect Transistors," U.S. Appl. No. 17/651,919, filed Feb. 22, 2022.

International Searching Authority, "Invitation to Pay Additional Fees and Partial Search Report" Patent Cooperation Treaty, dated Aug. 12, 2024, 10 pages, International Application No. PCT/EP2024/064351.

International Searching Authority, "Notification of Transmittal of the International Search Report and the Written Opinion of the International Searching Authority, or Declaration," Patent Cooperation Treaty, Oct. 4, 2024, 20 pages, International Application No. PCT/ EP2024/064351.

* cited by examiner

200

216

204D
204C
204B
204A

218

202B
202A

206

200

216

210

200

230A          224          230B 228A          228B    228C    228D    228E          228F

210

200

208G
208F
208E
208D
208C
208B
208A

200

230A                          230B 204D
204C
204B
204A
226
202B
202A

232

208G
208F
208E
208D
208C
208B
208A

210

200

200

200

204D
204C
204B
204A
202B
202A

226

200

200

200

300

300

STACKED FET WITH LOW PARASITIC-CAPACITANCE GATE

BACKGROUND

The present invention relates to nanosheet field effect transistors, and more specifically, to stacked nanosheet field effect transistors.

Nanosheet field effect transistors are a type of field effect transistor (FET) in which a set of parallel semiconductor sheets (referred to herein as "nanosheets") are patterned such that they are layered over each other. The set of nanosheets is typically surrounded on each side by gate material (sometimes referred to as "work function metal") that can be used to switch the state of the FET. Each nanosheet in the set is typically also separated from each other nanosheet by gate material. As a result, each nanosheet in a typical nanosheet FET has high contact area to the FET gate, causing the performance of the FET to be higher than previous FET designs (e.g., planar FETs).

In a stacked nanosheet cell design, two complementary nanosheet FETs are patterned over each other in the same dimension in which the nanosheets within each FET are patterned over each other. These two FETs are typically referred to as a "top FET" and a "bottom FET" based on their positions relative to the silicon substrate on which the nanosheet cell is formed. Specifically, the FET that is closer to the silicon substrate is typically referred to as the "bottom FET," and the FET that is farther from the silicon substrate is typically referred to as the "top FET."

SUMMARY

Some embodiments of the present disclosure can be illustrated as a semiconductor device comprising a top field effect transistor (FET) and a bottom FET. The top FET and bottom FET are in a stacked profile. The semiconductor device also comprises a gate. The gate comprises two top-FET gate extensions and two bottom-FET gate extensions. The semiconductor device also comprises an insulator liner. The insulator liner interfaces with the two top-FET gate extensions and two bottom-FET gate extensions. The semiconductor device also comprises a dielectric that interfaces with the insulator liner.

Some embodiments of the present disclosure can also be illustrated as a semiconductor device comprising a top field effect transistor (FET). The top FET comprises a first sidewall gate extension and a second sidewall gate extension. The semiconductor device also comprises a bottom FET. The bottom FET comprises a third sidewall gate extension and a fourth sidewall gate extension. The top FET and bottom FET are in a stacked profile, and the first, second, third, and fourth sidewall gate extensions are of equal thickness.

Some embodiments of the present disclosure can also be illustrated as a semiconductor device comprising a top field effect transistor (FET). The top FET comprises a first sidewall gate extension and a second sidewall gate extension. The semiconductor device also comprises a bottom FET. The bottom FET comprises a third sidewall gate extension and a fourth sidewall gate extension. The top FET and bottom FET are in a stacked profile. The semiconductor device also comprises an upper gate extension that connects to the first and second sidewall gate extension. The first, second, third, and fourth sidewall gate extensions are of equal thickness.

DETAILED DESCRIPTION

Stacked nanosheet cell designs permit increased cell density, and corresponding performance increases, even beyond the advances resulting from the standard nanosheet FET design. However, each FET in the stacked cell typically requires a contact spanning from the top of the cell (i.e., opposite of the silicon substrate) to the diffusion regions (i.e., source or drain). Thus, in the typical stacked nanosheet cell design, the contact for the bottom FET diffusion regions passes through the top FET. This often requires that the nanosheet cell is formed in a stepped profile, in which the nanosheets of the top FET are not as wide as the nanosheets in the bottom FET. This provides an area through which the contact for the bottom-FET diffusion regions can travel. This area is often referred to herein as the top FET cutout region.

However, in the typical stacked FET design, the space to the left and right of the set of nanosheets is filled by gate material. Because the nanosheets in the top FET of a nanosheet cell are narrower than the nanosheets in the bottom FET of the nanosheet cell, the top FET of the cell is typically surrounded by more gate material than the bottom FET. In other words, the top FET cutout region is filled only with gate material, whereas the corresponding area of the bottom FET contains semiconductor nanosheets and diffusion regions.

Further, because the gate is composed of work function metal, the gate surrounding the FETs has a high capacitance. Thus, filling the top FET cutout region in the top FET with a large mass of gate material can cause a significant amount of parasitic capacitance at the top FET, reducing the switching speed of the top FET. Further, the excess gate material in the top FET cutout region can create capacitance between the top FET gate and the contact for the bottom FET diffusion regions, reducing the switching speed of the bottom FET as well. In some use cases, this parasitic capacitance can be significant enough to not only affect the performance of the FETs in the cell, but also the FETs of adjacent stacks.

Some embodiments of the present disclosure address these and other issues by forming a self-aligned gate within a dielectric fill when forming a stacked FET. In some embodiments, this self-aligned gate may be formed with little or no work function metal within the top gate cutout area, significantly reducing parasitic capacitance between the gate material and the contact for the bottom FET diffusion regions. Of further benefit, forming a self-aligned gate obviates a need for a gate cut between adjacent cells. As a result, adjacent cells can be placed significantly closer together without a need of a gate cut damaging FET structures.

Figures 1A, 1B:
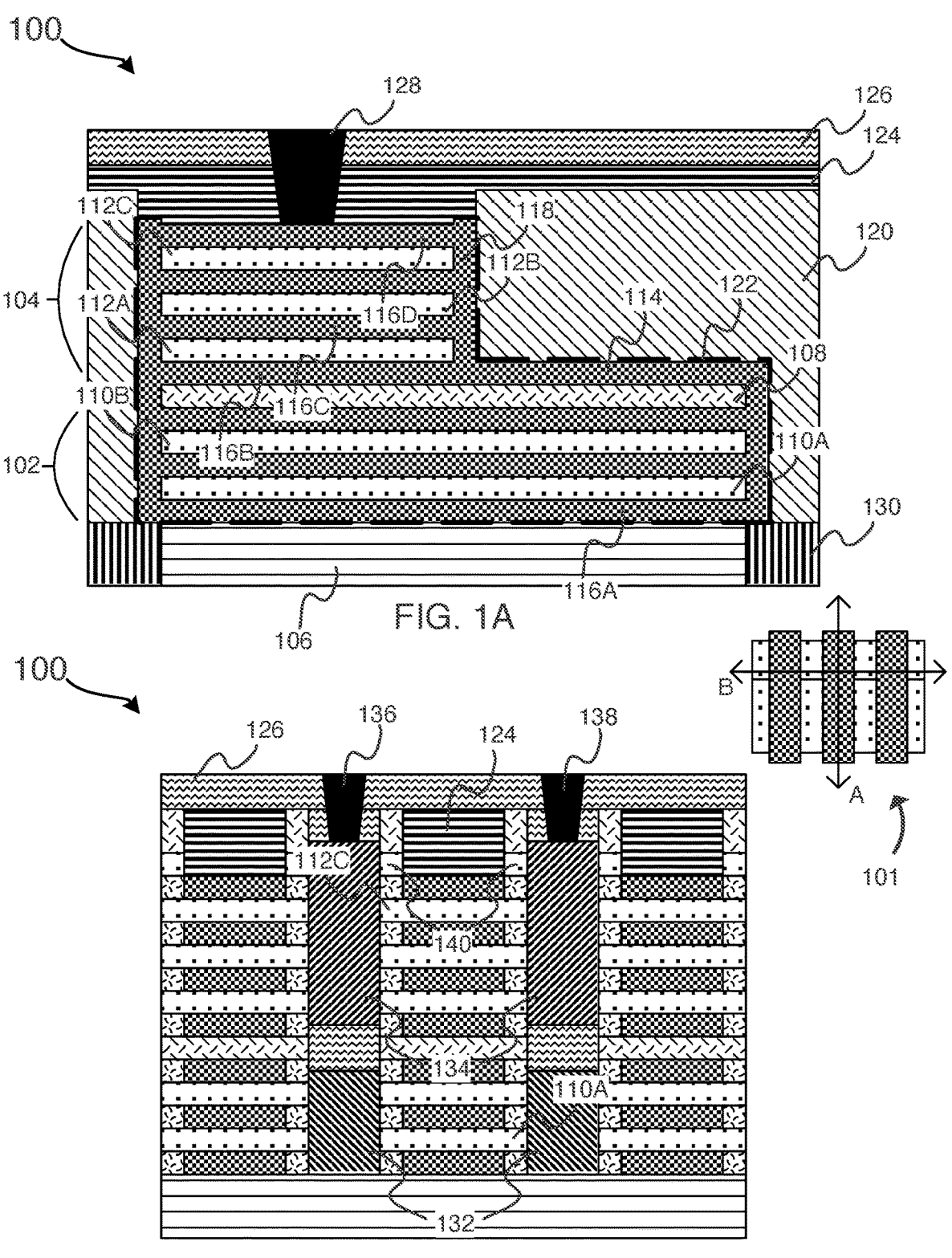
FIGS. 1A and 1B depict a semiconductor cell in a stacked FET design with a self-aligned gate and a self-aligned-contact cap, in accordance with embodiments of the present disclosure.

For example, FIGS. 1A and 1B illustrate a stacked FET structure 100 in which a self-aligned gate has been formed in accordance with embodiment of the present disclosure. As noted in the legend 101, FIG. 1A represents a cross-sectional view as if stacked FET structure 100 were sliced in the A dimension, and FIG. 1B represents a cross-sectional view as if stacked FET structure 100 were sliced in the B dimension. The cross-sectional view of FIG. 1B (and of other figures illustrating the same cross sectional perspective) may be referred to herein as "cross-gate cut."

Stacked FET structure 100 includes a bottom FET 102 and a top FET 104. Bottom FET 102 and top FET 104 are in a stacked configuration. Stacked FET structure 100 contains a silicon substrate 106 on which a bottom FET 102 is patterned. Top FET 104 is patterned upon bottom FET 102, and FETs 102 and 104 are separated by a middle dielectric isolation sheet 108.

Bottom FET 102 contains silicon nanosheets 110A and 110B. Top FET 104 contains silicon nanosheets 112A, 112B and 112C. Top and bottom FETs 102 and 104 contain self-aligned gate 114. As illustrated in FIG. 1A, self-aligned gate 114 is partially composed of several gate sheets that are situated between silicon nanosheets 110A, 110B, 112A-112C, and middle dielectric isolation sheet 108. A "gate sheet" as used herein, refers to a gate fill in a suspension region between channel sheets or between the top/bottom sheet of a FET and neighboring components. Such gate sheets are illustrated by gate sheets 116A, 116B, and 116C (referred to collectively as "gate sheets 116").

For example, gate sheet 116A may be referred to as the bottom gate sheet of bottom FET 102, because it is between the bottom nanosheet of bottom FET 102 (i.e., nanosheet 110A) and a neighboring component that is not part of the channel (i.e., silicon substrate 106). Gate sheet 116B may be referred to as the bottom gate sheet of top FET 102, because it is between the bottom nanosheet of top FET 104 (i.e., nanosheet 112A) and a neighboring component that is not part of the channel (i.e., middle dielectric isolation sheet 108). Of note, part of bottom gate sheet 116B extends horizontally past top FET 104. This portion of bottom gate sheet 116B is between dielectric 120 and middle dielectric isolation sheet 108, and may be referred to as a "horizontal gate extension" or a "middle dielectric isolation gate sheet." Gate sheet 116C may be referred to as a middle gate sheet, because it is between two nanosheets of the same FET (i.e., nanosheets 112A and 112B of top FET 104). Gate sheet 116D may be referred to as the top gate sheet of top FET 102, because it is between the top nanosheet of top FET 102 (i.e., nanosheet 112C) and a neighboring component that is not part of the channel (i.e., self-aligned-contact cap 124).

Self-aligned gate 114 is also partially composed of gate extensions that border the left and right sides (as illustrated in FIG. 1A) of silicon nanosheets 110A, 110B, 112A-112C, and middle dielectric isolation sheet 108. Such gate extensions are represented in FIG. 1 by the right gate extension of top FET 104, labeled as gate extension 118. These gate extensions may sometimes referred to as "vertical gate extensions," "sidewall gate extensions," or "gate sidewalls" to distinguish from the "horizontal gate extension" portion of gate sheet 116B. However, for the purposes of this disclosure, the term "gate extension" shall be interpreted as referring to a vertical gate extension, such as gate extension 118, rather than a horizontal gate extension, unless otherwise specified. For example, the phrase "the top FET gate extension" would refer to a vertical gate extension, but the terms "horizontal gate extension" and "upper gate extension" would not.

Of note, as illustrated in FIG. 1A, each FET has a left gate extension and a right gate extension. Further, the gate extensions on the right and left sides of both top FET 104 and bottom FET 102 are approximately equal. As will be explained with respect to FIGS. 2A-2HH, this is due to the controllable fashion in which the precursor for the gate extensions can be grown. Further, as illustrated in FIG. 1A, the width of the gate extensions (as measured in the dimension that runs from the left of FIG. 1A to the right of FIG. 1A) are relatively equal to the height of the gate sheets (as measured in the dimension that runs from the bottom of FIG. 1A to the top of FIG. 1A). This may, in some embodiments, enable more uniform contact between the self-aligned gate 114 and silicon nanosheets 110A-110B and 112A-112C.

Stacked FET structure 100 also includes dielectric fill 120, which may have formed a template in which self-aligned gate 114 was grown. This will be explained further in FIGS. 2A-2HH. As such, stacked FET structure 100 also contains an insulator layer of hafnium oxide 122 surrounding all sides of self-aligned gate 114 except for immediately above silicon nanosheet 112C and the top surfaces of the nearby gate extensions. This hafnium oxide is represented as a dashed line within FIG. 1A.

Stacked FET structure 100 also contains a self-aligned-contact cap 124 formed over self-aligned gate 114 and dielectric 120. An inter-layer dielectric 126 is formed upon self-aligned-contact cap 124. Visible in FIG. 1A, stacked FET structure 100 also discloses a gate contact 128 and a shallow trench isolation 130. Visible in FIG. 1B, stacked FET structure 100 also contains bottom-FET diffusion regions 132 and top-FET diffusion regions 134. Top-FET diffusion regions 134 are contacted by contacts 136 and 138.

Of note, top FET 104 is illustrated in FIG. 1B as including sacrificial-channel spacers 140. These spacers will be explained further in FIGS. 2A-2HH.

Of further note, the FIGS. 1A, 1B, and the remaining figures illustrated within do not necessarily include all components and materials that may be present within the depicted FETs and cells. This is for the sake of presenting a more easily understandable depiction of the components that are presented. For example, adhesion and barrier layers may be formed between many components of the figures, but are often not depicted in the figures.

Again of further note, in some figures, a distinct, identifiable interface between two components of the same material may be illustrated for the sake of understanding, even when that interface may not be distinct in practice. This is to emphasize, again for the sake of understanding, that the two components were added at separate stages. This distinct depiction, however, is not necessarily intended to imply that any interface between two components of the same material would be identifiable in practice. An example of this can be viewed in FIG. 2E in the distinct interface between the SiGe layer 220 and SiGe layers 208. In practice, because these components are likely to be formed of the same SiGe material, they may meld together and form a single component.

Finally, it is important to note that the relative proportions of components in FIGS. 1A, 1B, and the remaining figures of this disclosure are, unless otherwise noted, chosen for the sake of understanding, not necessarily to imply a required relationship between those components in practice. Thus, the relative lengths, widths, depths, and heights of components as illustrated may be different in practice. For example, ratio between the width of nanosheet 112C to the height of nanosheet 112C may be illustrated as significantly larger in FIG. 1A than it would be in real-world use cases. Similarly, the ratio between the width of nanosheet 12C to the height of self-aligned-contact cap 124 may be illustrated as significantly smaller in FIG. 1A than it would be in real-world use cases.

Similarly, ratios of the numbers and sizes of nanosheets in illustrated top FETs to the numbers and sizes of nanosheets in illustrated bottom FETs may be larger or smaller in real-world use cases. In some real-world use cases, for example, it may be beneficial for the total surface area of nanosheets 110A-110B that is exposed to self aligned gate 114 to be approximately equal to the total surface area of nanosheets 114A-114C that is exposed to gate material 114. Therefore, as the ratio of the width of nanosheets 114A-114D to the width of nanosheets 110A-110B decreases, more nanosheets may be required in top FET 106 to account for the decreased relative width and to cause the surfaces areas of the nanosheets in both top FET 104 and top FET 106 to be approximately equal.

Figures 2A, 2B:
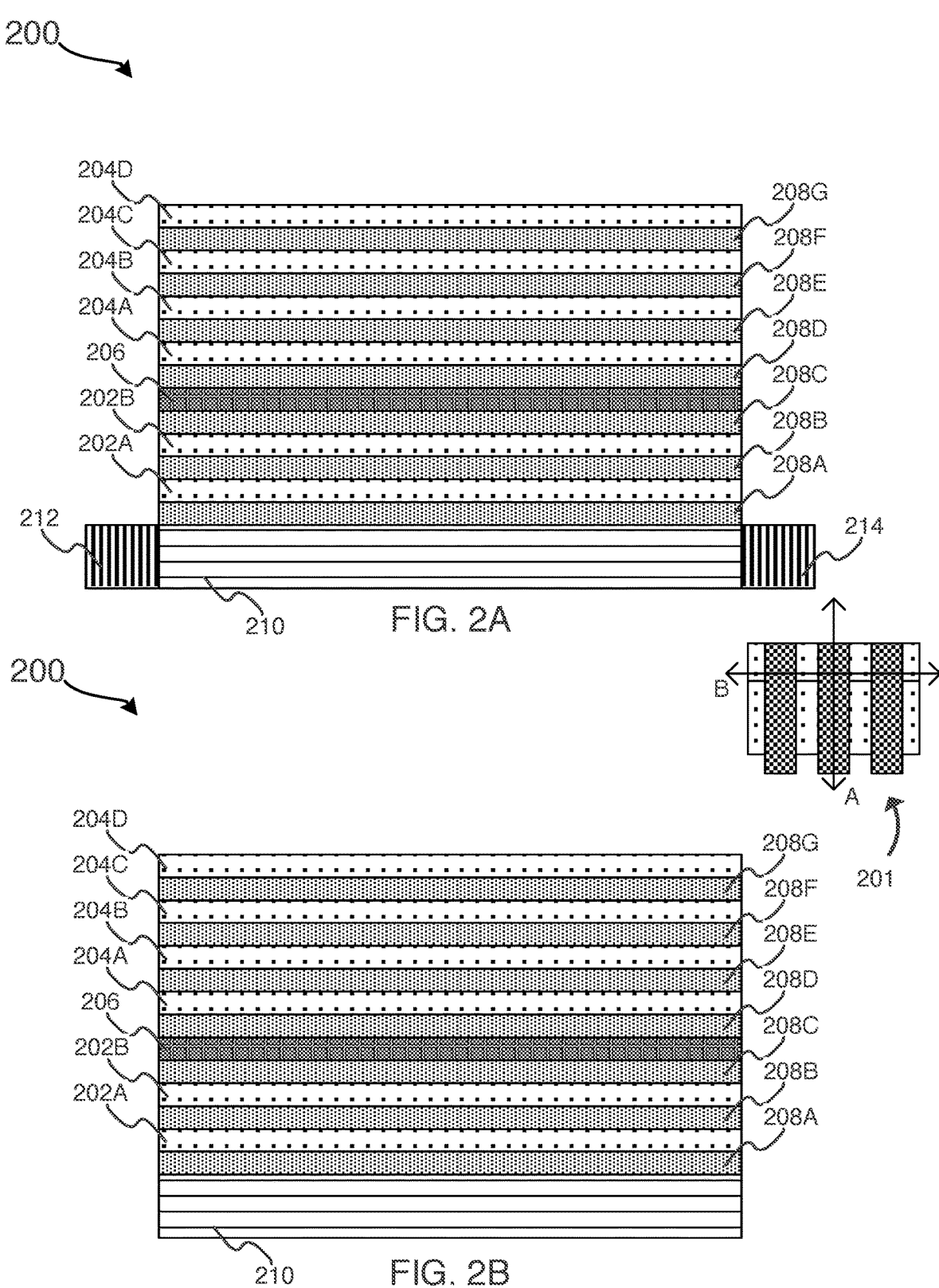
FIGS. 2A-2HH depict various stages in an example process of forming a semiconductor cell in a stacked FET design with a self-aligned gate and a self-aligned-contact cap, in accordance with embodiments of the present disclosure.

FIGS. 2A-2HH depict various stages in an example process of forming a stacked FET structure 200 in a stacked FET profile with a self-aligned gate and self-aligned-contact cap according to embodiments of the present disclosure. Of note, FIGS. 2A-2HH, like FIGS. 1A-1B, are presented as cross sections of a semiconductor cell. Throughout FIGS. 2A-2HH, the figure views on the top of the sheet represent the view of cross section A illustrated in legend 201 unless otherwise noted (e.g., FIG. 2I). The figure views on the bottom of the sheet represent the view of cross section B illustrated in legend 201. For example, FIG. 2A illustrates the cross section view A, and FIG. 2B illustrates the cross section view B.

FIGS. 2A and 2B, for example, illustrate a first stage in forming stacked FET structure 200. In this stage, two sets of semiconductor nanosheets have been patterned upon silicon substrate 210. Specifically, silicon nanosheets 202A and 202B (sometimes collectively referred to herein as "nanosheets 202") represent the first set and silicon nanosheets 204A, 204B, 204C, and 204D (sometimes collectively referred to herein as "nanosheets 204") represent the second set. The first set of nanosheets 202 are separated by the second set of nanosheets 204 by a layer of silicon germanium 206 (sometimes referred to herein as "SiGe layer 206" or even simply "SiGe 206") of a particular percentage of germanium. SiGe layer 206 may be, for example, 55 percent germanium, also referred to as SiGe55.

Each of the nanosheets within nanosheets 202 and 204 are separated by a layer of silicon germanium from another set of silicon germanium layers. Specifically, silicon germanium layers 208A, 208B, 208C, 208D, 208E, 208F, and 208G separate the nanosheets within nanosheets 202 and 204 from each other and from SiGe layer 206. Silicon germanium layers 208A-208G (sometimes collectively referred to herein as "silicon germanium layers 208") may be of a percentage of germanium that differs from the percentage of germanium in SiGe layer 206. For example, silicon germanium layers 208 (sometimes referred to herein as "SiGe layers 208") may be, for example 30 percent germanium, also referred to as SiGe30.

Of note, FIG. 2A also illustrates shallow trench isolation features 212 and 214. Shallow trench isolation (sometimes referred to herein as "STI") features 212 and 214 may be composed of a dielectric material, such as silicon dioxide ($SiO_2$), or a combination of a SiN liner and SiO2.

Figure 2C:
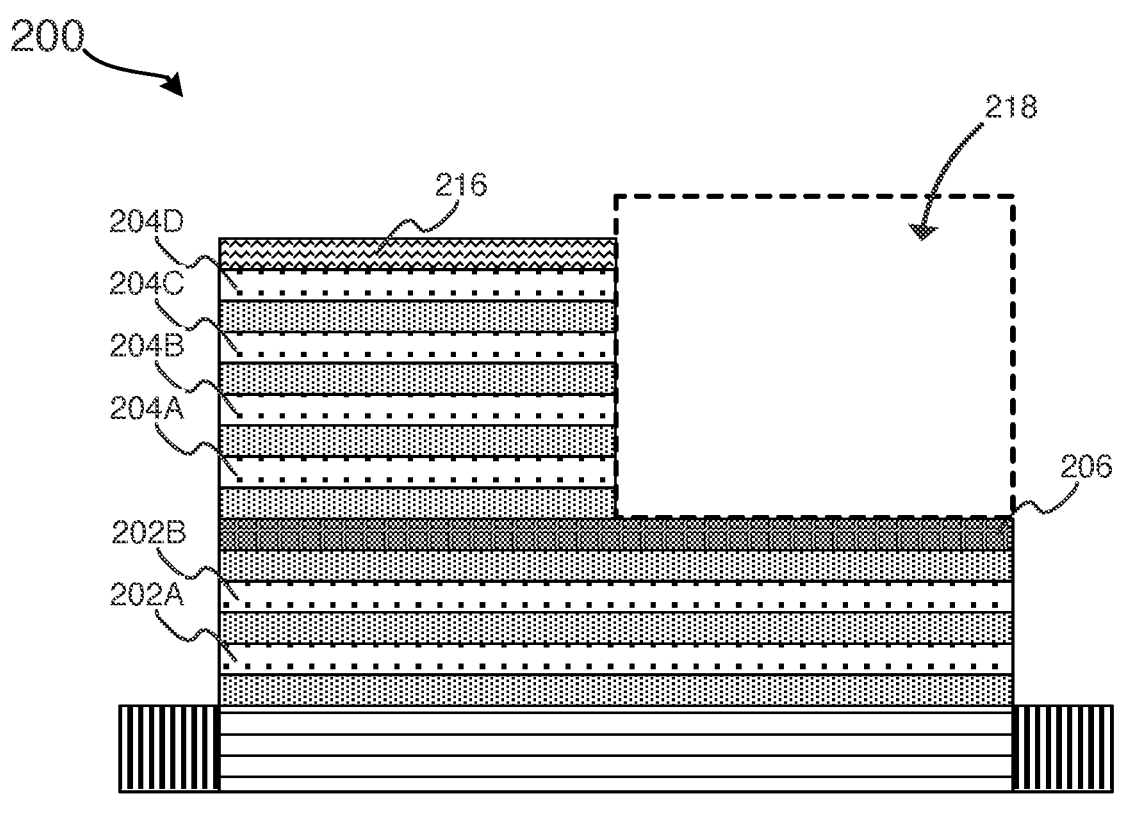
Figure 2D:
Figure 2D:

FIGS. 2C and 2D illustrate a second stage in forming stacked FET structure 200. In this stage, a hardmask 216 has been applied to the left side of silicon nanosheet 204D, as illustrated in the view of FIG. 2C. A patterning process including conventional lithography and etching processes was then performed upon stacked FET structure 200, resulting in top FET cutout region 218, illustrated in FIG. 2C by a dashed line. In some embodiments, this etch may be performed with an etchant that is selective to hardmask 216 and SiGe layer 206, such that hardmask 216 protects nanosheet 204D from etching and such that SiGe layer 206 acts as an etch stop. After this etching process hardmask 216 can be removed.

Figure 2E:
Figure 2E:
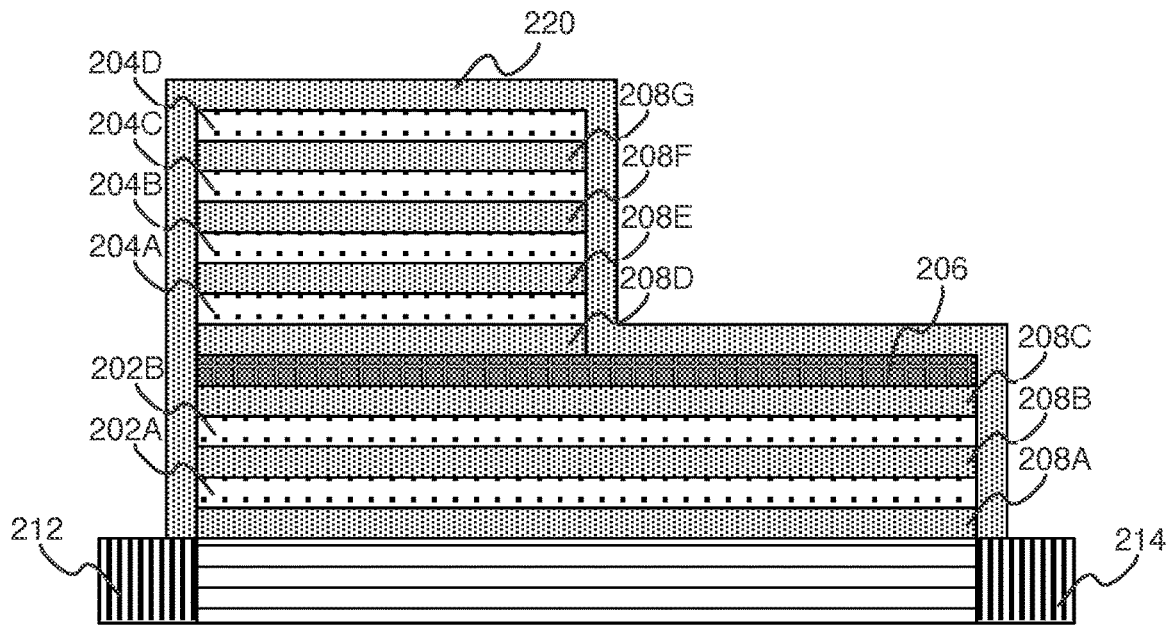
Figure 2F:
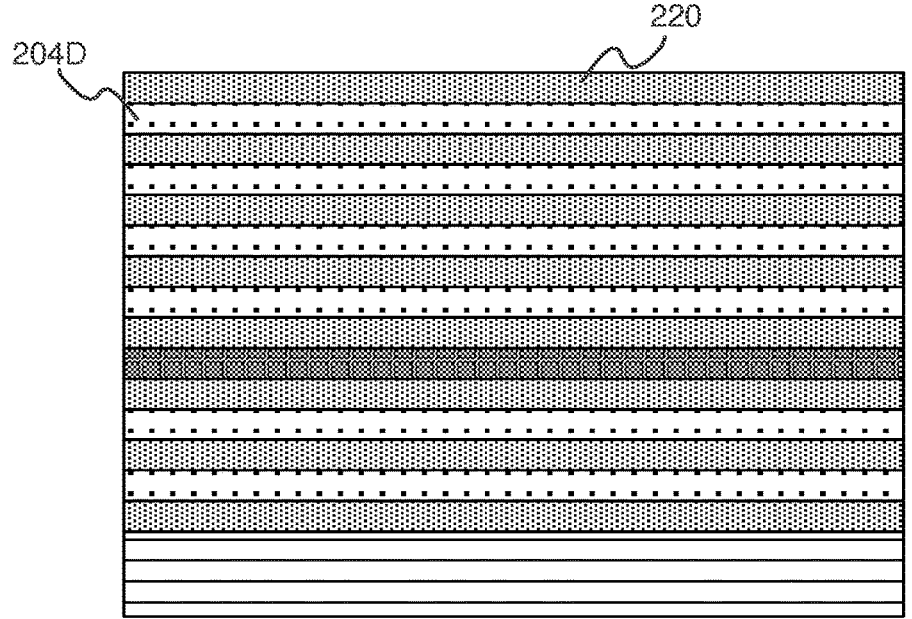

FIGS. 2E and 2F illustrate a third stage in forming stacked FET structure 200. In this stage, a further layer of SiGe, SiGe layer 220, has been conformally grown over, as illustrated in the view of FIG. 2E, the sides of nanosheets 202 and 204, the top of nanosheet 204D, the sides of SiGe layers 208, the sides of SiGe layer 206, and the top surface of SiGe layer 206 that was exposed in the previous stage.

As noted, the growth of SiGe layer 220 is conformal, and as such the thickness of SiGe layer 220 is relatively equal throughout SiGe layer 220. Further, in some embodiments the rate of growth may be precisely controllable. As such, it may be feasible to time the growth such that the thickness of SiGe layer 220 is equal to the height of SiGe layers 208. Finally, in some embodiments, epitaxial growth of SiGe layer 220 is utilized. In these embodiments, SiGe layer 220 does not grow over STI features 212 and 214. This may eliminate the need to remove excess SiGe.

In some embodiments, SiGe layer 220 is the same SiGe percentage as SiGe layers 208 (e.g., SiGe30). In these embodiments, removing SiGe layer 220 and SiGe layers 208 simultaneously may be efficient. This removal is discussed in later stages of forming stacked FET structure 200. In embodiments in which SiGe layer 220 is not composed of the same exact percentage as SiGe layers 208, it may still be beneficial to form SiGe layer 220 and SiGe layers 208 out of percentages that are sufficiently similar to enable simultaneous removal.

Figures 2G, 2H:
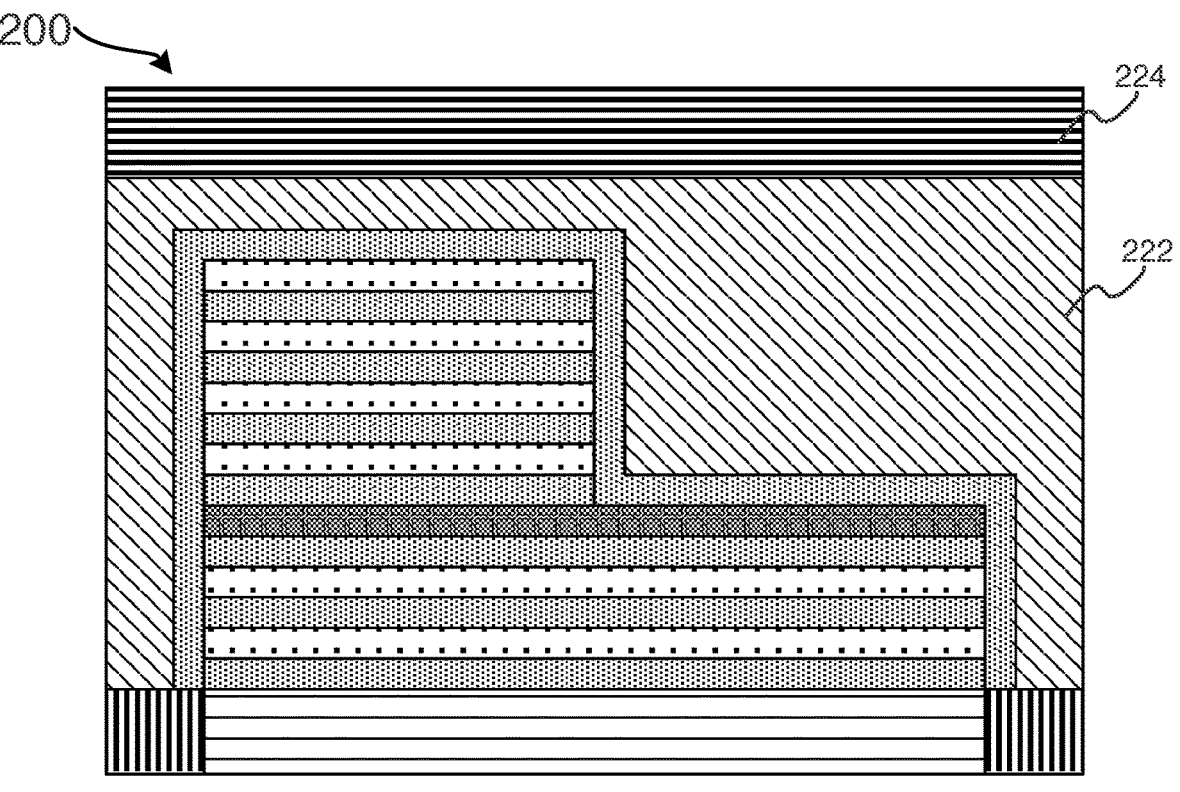

FIGS. 2G and 2H illustrate a fourth stage in forming stacked FET structure 200. In this stage, a dielectric 222 and hardmask 224 have been applied to stacked FET structure 200. Dielectric 222 may be composed, for example, of silicon carbide (SiC), carbon doped silicon oxide (SiOC), or SiOCN, SiBCN, etc. Hardmask 224 may be composed of, for example, silicon nitride (SiN).

Figures 2I, 2J:
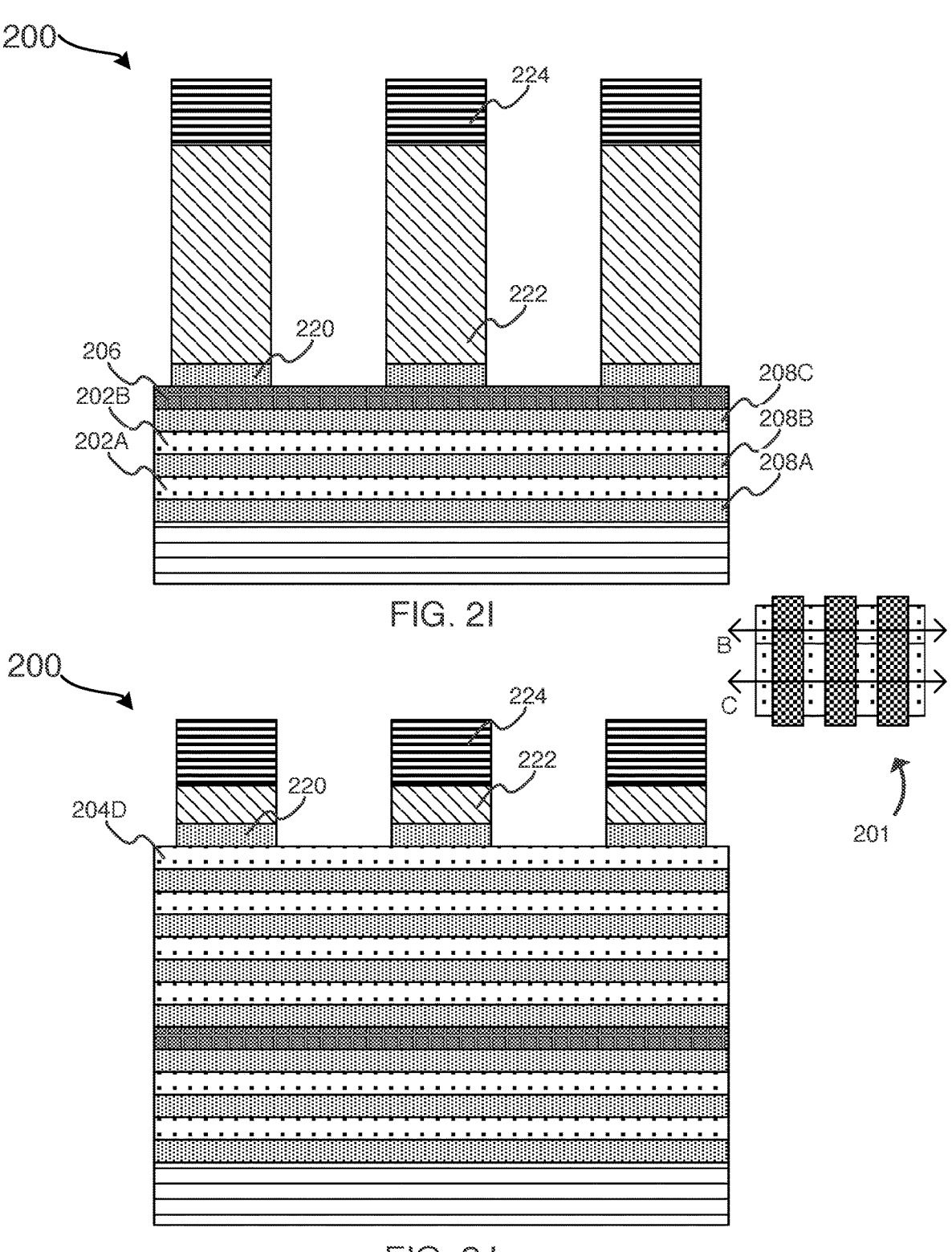

FIGS. 2I and 2J illustrate a fifth stage in forming stacked FET structure 200. Of note, FIG. 2I deviates from the pre-established pattern and illustrates a view of cross-section C shown in legend 201. As such, FIG. 2I illustrates a cross section of stacked FET structure 200 where nanosheets 204 were removed in the stage illustrated in FIG. 2C. In other word, FIG. 2I illustrates a cross section view of stacked FET structure 200 that extends through top FET cutout region 218.

In this fifth stage of forming stacked FET structure 200, dielectric 222 and hardmask 224 are patterned using a directional etch such as reactive ion etching. This results in gaps in the views illustrated in both FIG. 2I and FIG. 2J. These gaps which can later be used for patterning source and drain diffusion epitaxial regions. In some embodiments, this etching may be performed using an etchant that is selective to SiGe layer 220, causing SiGe layer 220 to act as an etch stop. However, as illustrated in FIGS. 2I and 2J, SiGe layer 220 has also been removed in from the gaps between hardmasks 224 and dielectric 222. Thus, in such embodiments a second directional etch process that is not selective to SiGe layer 220 would be performed. In these such embodiments, this second etch process may be selective to silicon nanosheet 204D and SiGe layer 206. In some embodiments, a single directional etch process may pattern all of hardmask 224, dielectric 222, and SiGe layer 220. In these embodiments, the etchant used may be selective to both silicon nanosheet 204D and SiGe layer 206.

Of note, the directional etch of SiGe layer 220 has resulted in exposing SiGe layer 206 between the pillars of SiGe layer 220, dielectric 222, and hardmask 224 in FIG. 2I (i.e., below top FET cutout region 218). This exposure allows the removal of SiGe layer 206 in the next stage.

Figures 2K, 2L:
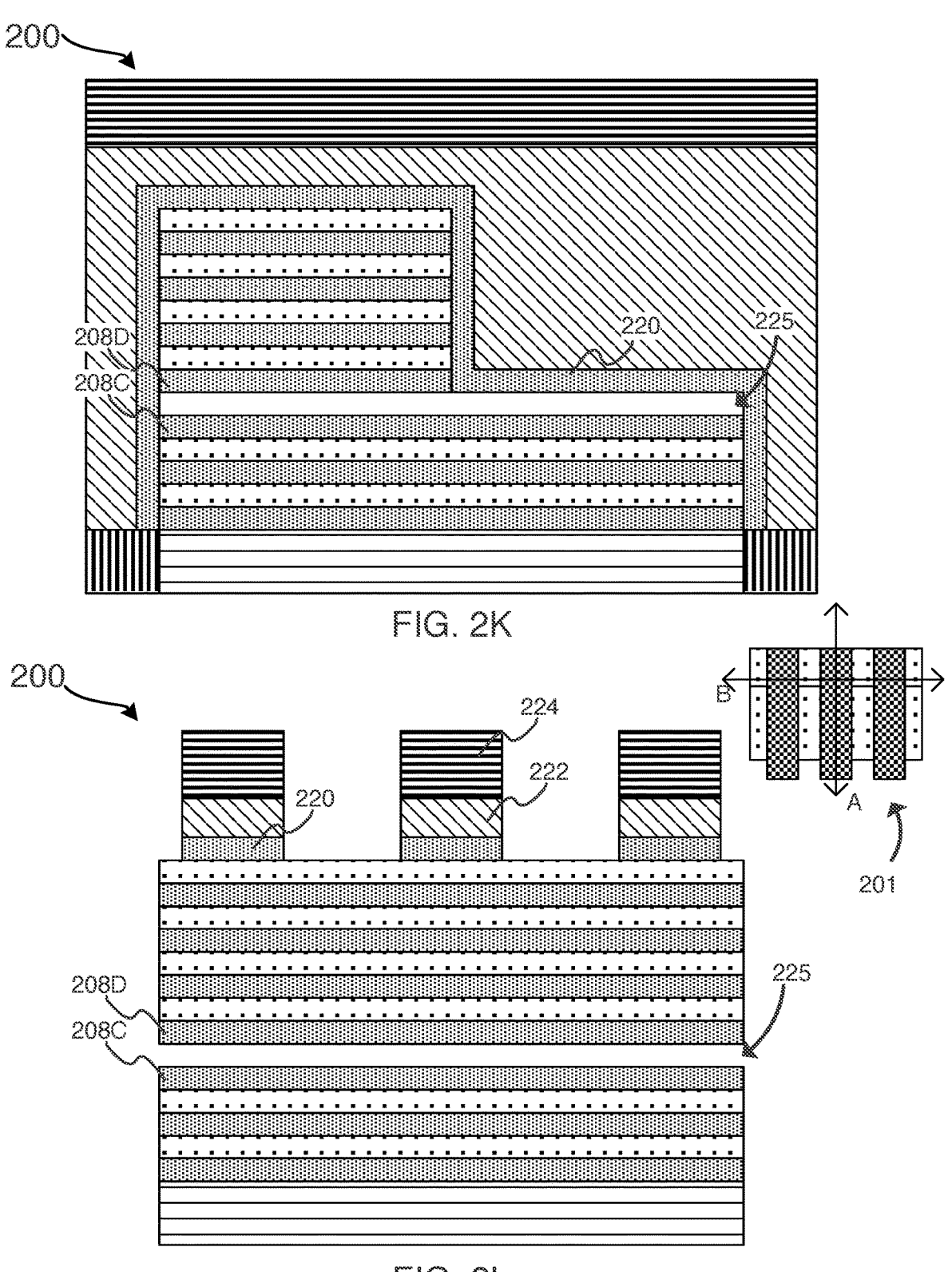

FIGS. 2K and 2L illustrate a sixth stage in forming stacked FET structure 200. Of note, FIG. 2K resumes the pre-established pattern of illustrating a view of cross-section B in legend 201. In this stage, SiGe layer 206 has been completely selectively, leaving a void 225 between SiGe layers 208C and 208D and between SiGe layer 208C and SiGe layer 220. For example, SiGe layer 206 could be etched by a vapor phase HCl dry etch that is selective to nanosheets 202, nanosheets 204, and SiGe layers 208A-208G but not to SiGe layer 206.

Figure 2M:
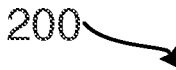
Figure 2M:
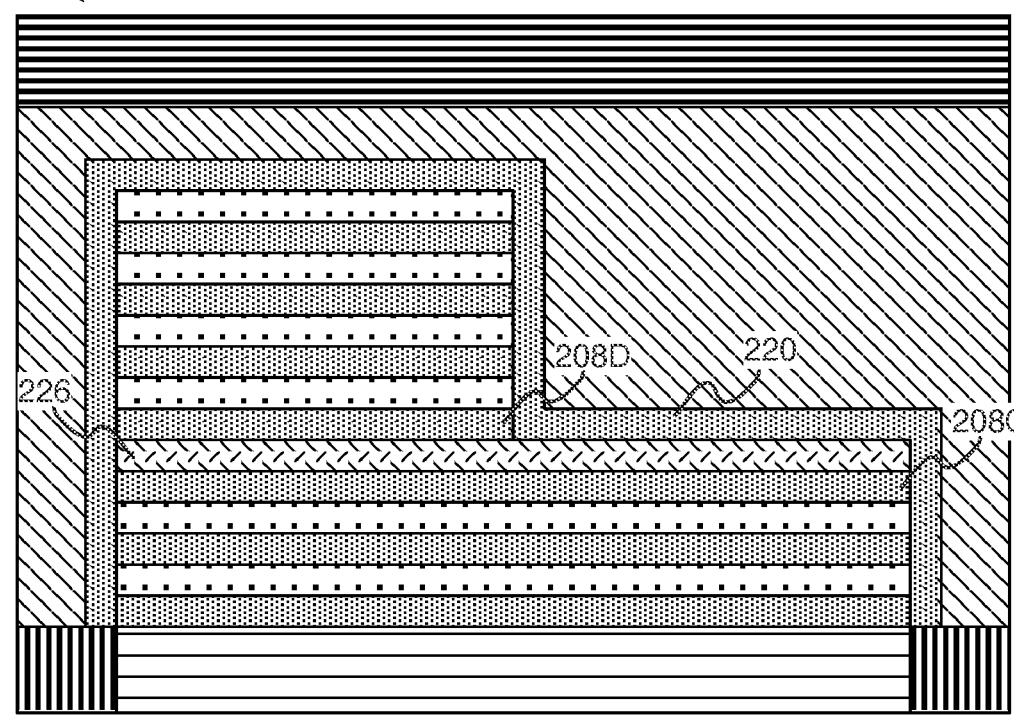
Figure 2N:
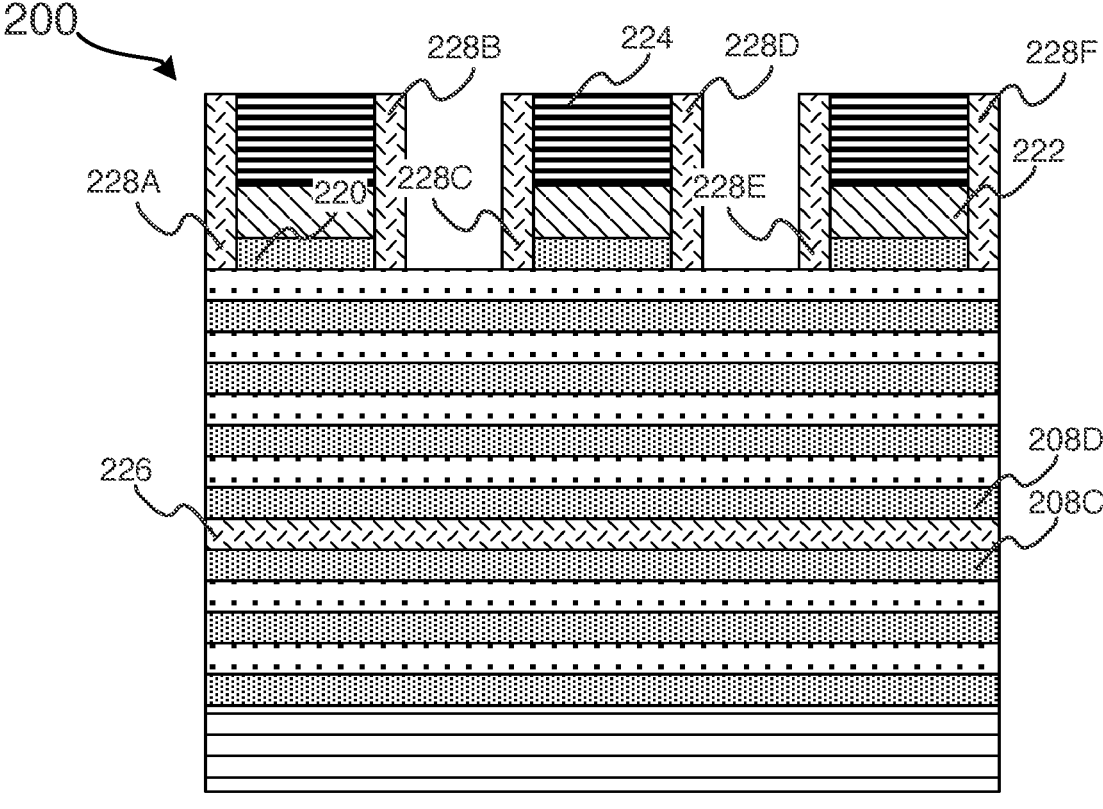

FIGS. 2M and 2N illustrate a seventh stage in forming stacked FET structure 200. In this stage, void 225 has been filled with dielectric material to create middle dielectric isolation layer 226 (sometimes referred to herein as "MDI layer 226" or simply "MDI 226"). MDI 226 could be formed of a dielectric with a low dielectric constant (sometimes referred to herein as a "low-K dielectric"), such as silicon oxycarbonitride (SiOCN). Similarly, gate spacers 228A, 228B, 228C, 228D, 228E, and 228F (sometimes collectively referred to as "gate spacers 228") have been applied using conformal deposition on the sides of the openings of the gaps within SiGe layer 220, dielectric 222, and hardmask 224. Gate spacers 228 could be composed of, for example, SiN, SiBCN, SiOCN, SiOC, and other similar compounds.

Figures 2O, 2P:

FIGS. 2O and 2P illustrate an eighth stage in forming stacked FET structure 200. In this stage, a direction etch, such as a reactive ion etch, has been performed to create the wells 230A and 230B. This directional etch may utilize and etchant that is selective to hardmask 224 and gate spacers 228. Wells 230A and 230B may be used later in the process to form diffusion regions for stacked FET structure 200.

Figure 2Q:
Figure 2Q:
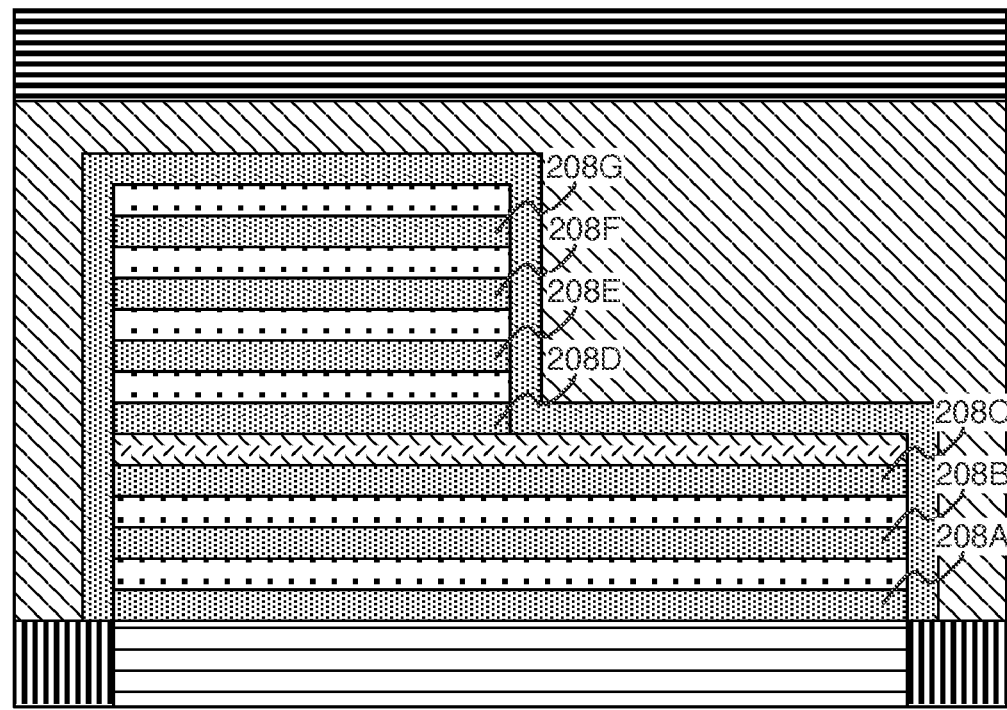
Figure 2R:
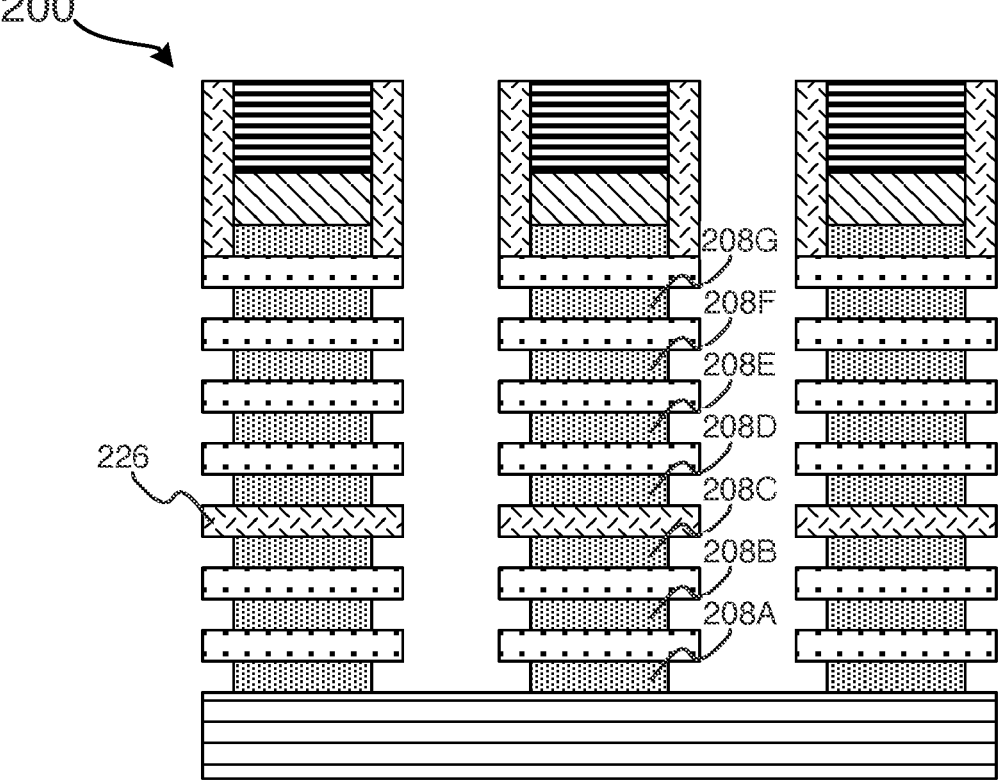

FIGS. 2Q and 2R illustrate a ninth stage in forming stacked FET structure 200. In this stage, SiGe layers 208 are indented using an etch solution that is selective to the non-SiGe components of stacked FET structure 200. For example, if SiGe layers 208 were composed of 30% germanium (i.e., SiGe30), SiGe layers 208 could have been etched with a solution of $NH_4OH$, $H_2O_2$, or $H_2O$. This has resulted in partial voids, also referred to as insets, between the silicon nanosheets 202 and 204 and MDI 226.

Figure 2S:
Figure 2S:
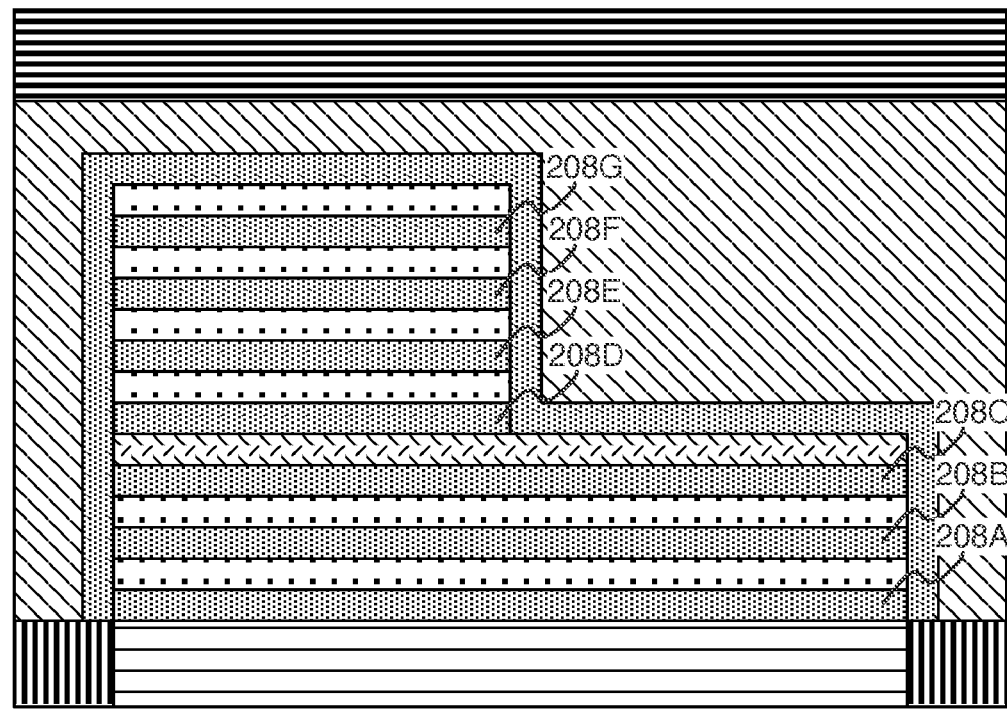
Figure 2T:
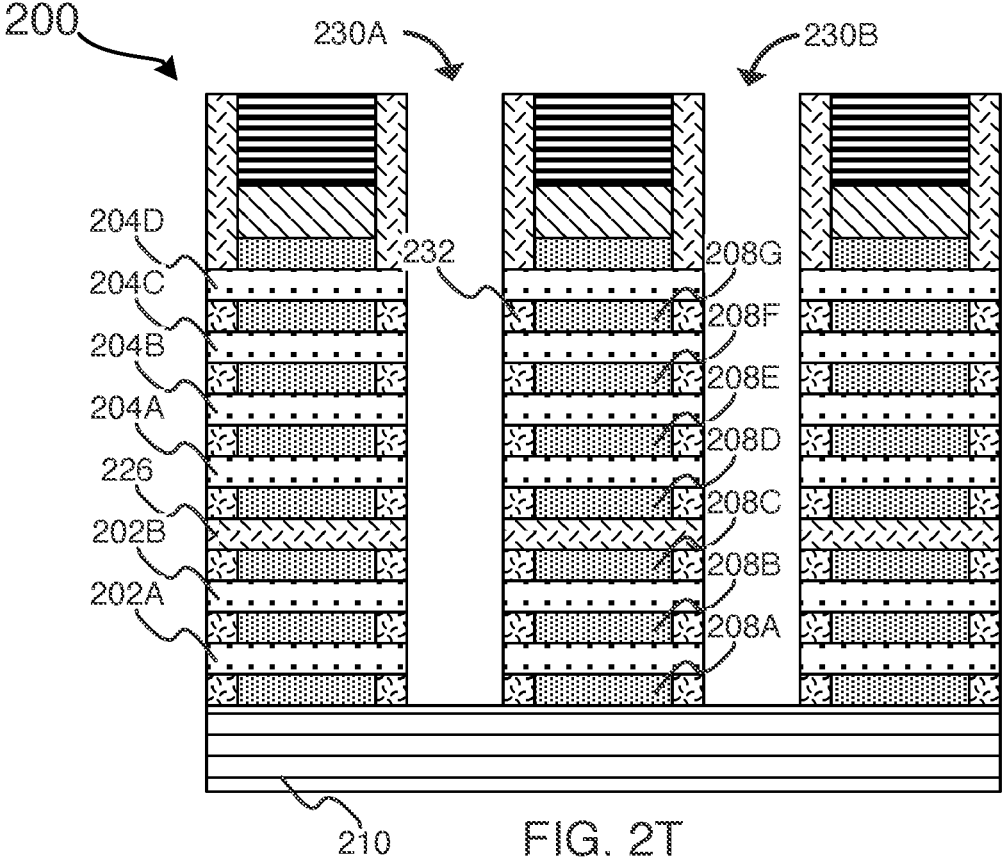

FIGS. 2S and 2T illustrate a tenth stage in forming stacked FET structure 200. In this stage, the insets formed in the eighth stage (illustrated in FIGS. 2O and 2P) have been filled with inner spacers, illustrated herein with example inner spacer 232. In some embodiments, these inner spacers may be formed of silicon oxide, silicon nitride, silicon oxynitride, SiBCN, SiOCN, SiOC, or any suitable combination of those materials. In some embodiments, this fill may have been performed through a conformal deposition (e.g., epitaxial growth) of the inner spacer material on the exposed surfaces of SiGe layers 208. In some embodiments, this conformal deposition may have also occurred on the exposed surfaces of silicon nanosheets 202 and 204, MDI layer 226, or both. After the initial deposition of the spacer material, an isotropic etch may be performed on stacked FET structure 200 to remove the inner spacer material from wells 230A and 230B.

Figure 2U:
Figure 2U:
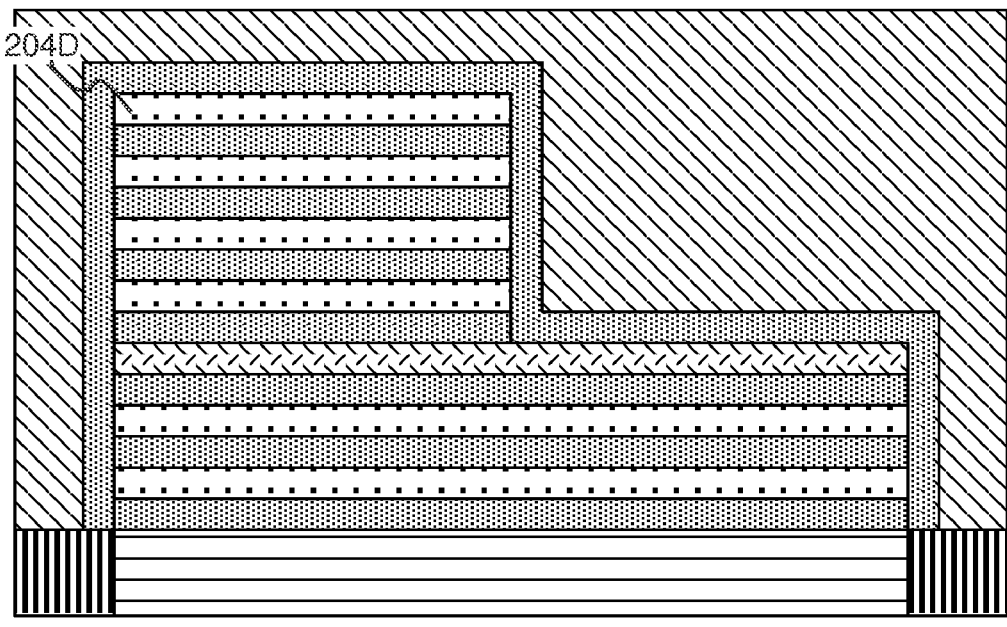
Figure 2V:
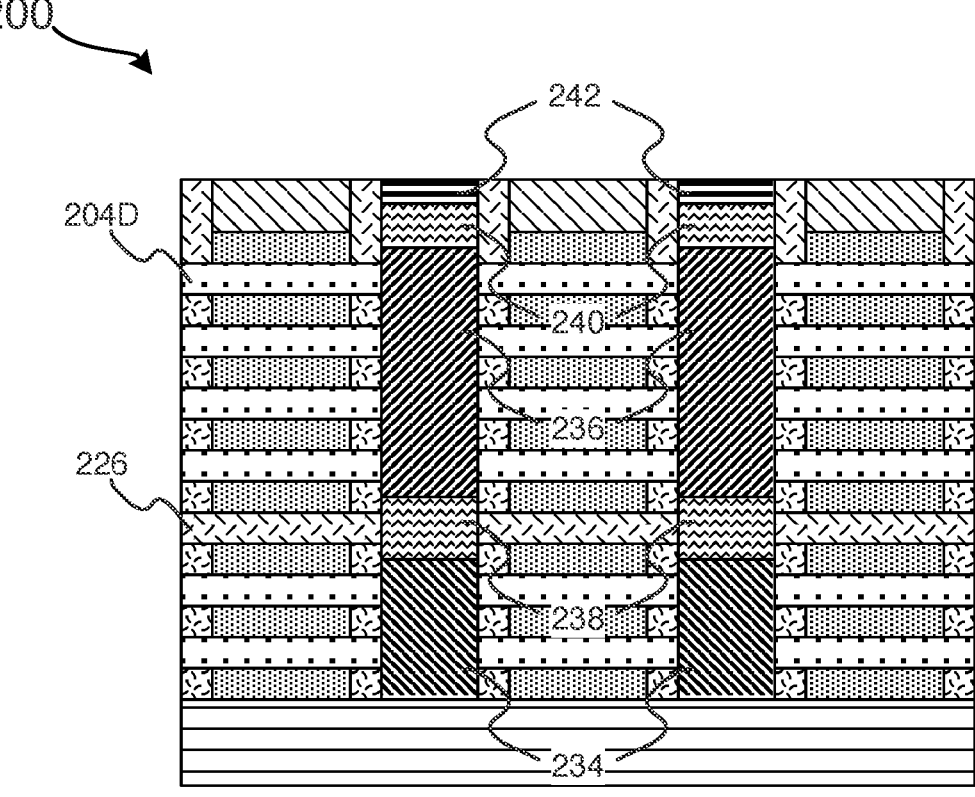

FIGS. 2U and 2V illustrate an eleventh stage in forming stacked FET structure 200. In this stage, bottom FET diffusion regions 234 and 236 are formed within wells 230A and 230B (no longer present in FIGS. 2S and 2T). Diffusion regions 234 may have been formed, for example, through epitaxial growth of doped silicon (e.g., silicon doped with boron, aluminum, gallium, or indium for a p-type diffusion region, silicon doped with phosphorus, arsenic, antimony, bismuth, or lithium for an n-type diffusion region) on the exposed surfaces of wells 230A and 230B. This doped silicon may have been etched to a level below MDI layer 226, after which inter-layer dielectrics 238 may have been formed upon the diffusion regions 234. The inter-layer dielectrics 238 may be formed, for example, of silicon dioxide ($SiO_2$).

Inter-layer dielectrics 238 may then have been planarized through chemical-mechanical planarization (sometimes referred to herein as "CMP"), after which diffusion regions 236 may have been formed within wells 230A and 230B in a process similar to that in which diffusion regions 234 were formed. Diffusion regions 236 may also be etched to a level just above the top surface of nanosheet 204D.

Dielectric capping layers 240 may have then been formed upon the diffusion regions 236. Dielectric capping layers 240 may be composed of $SiO_2$ and may have been formed in the same way that inter-layer dielectrics 238 may have been formed, and may also be formed, for example, of $SiO_2$. Dielectric capping layer 240 may have been planarized through CMP, after which it may have been recessed. Hardmasks 242 may then have been deposited upon the dielectric capping layer 240, after which hardmasks 242 may have been planarized using CMP. Of note, in the process of planarizing hardmasks 242, hardmask 224 has been removed. Hardmasks 242 may be composed, for example of silicon nitride (SiN). Hardmasks 242 may be useful avoid damaging dielectric capping layers 240 during future etching steps.

Figure 2W:
Figure 2W:
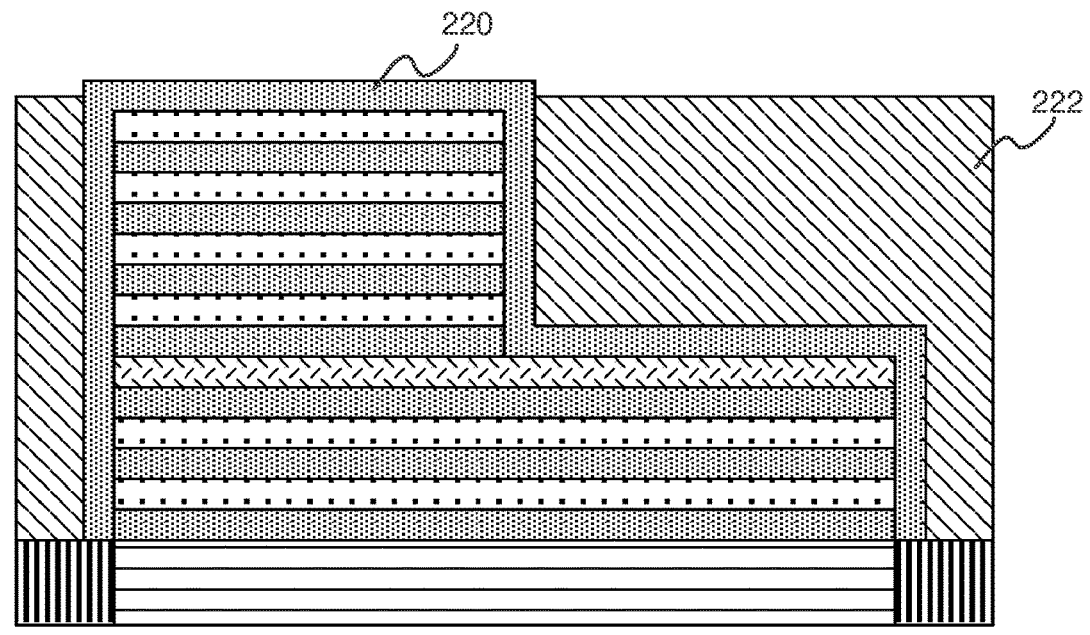
Figure 2X:
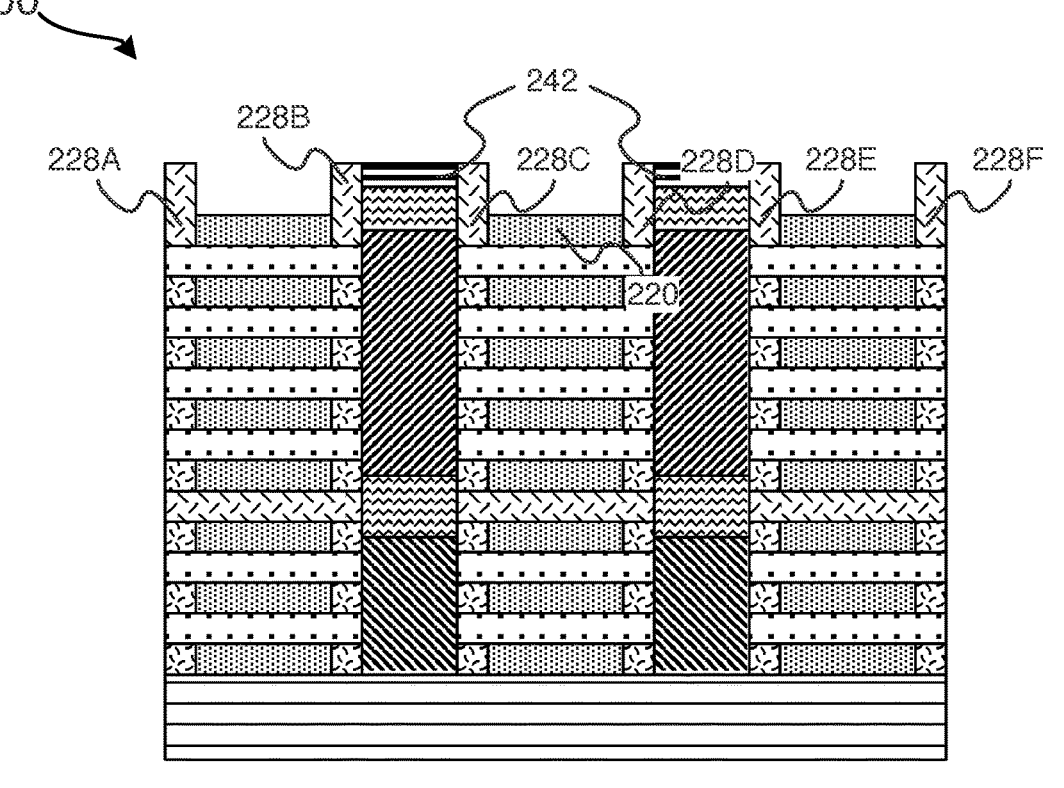

FIGS. 2W and 2X illustrate a twelfth stage in forming stacked FET structure 200. In this stage, dielectric 222 has been partially recessed such that SiGe layer 220 is partially exposed in the view illustrated by FIG. 2W. This recess, for example, could have been performed using an etchant that is selective to hardmasks 242 and spacers 228. Exposing SiGe layer 220 may facilitate removal of SiGe layers 208 and SiGe layer 220

Figure 2Y:
Figure 2Y:
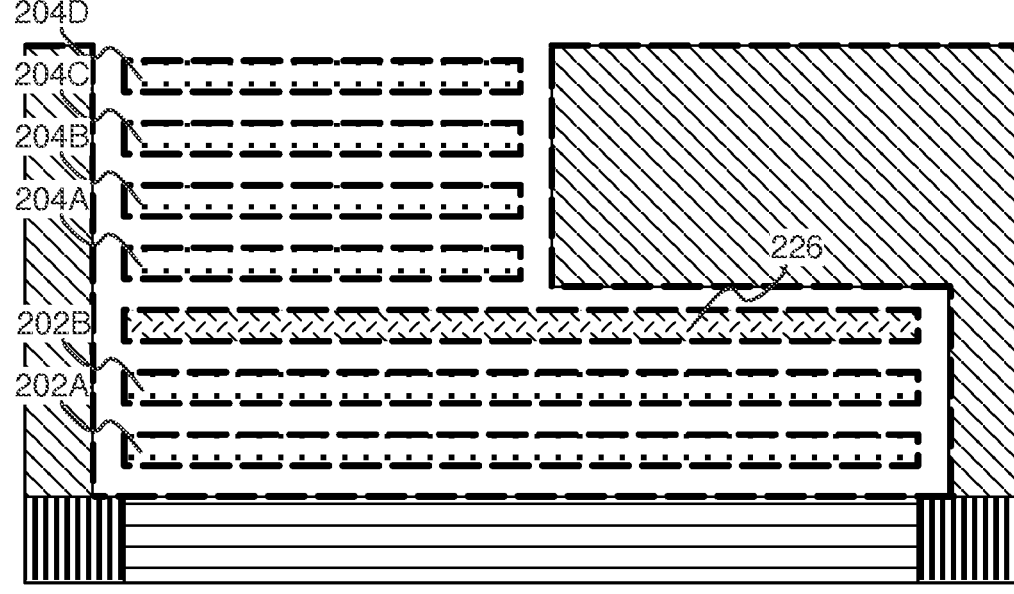
Figure 2Z:
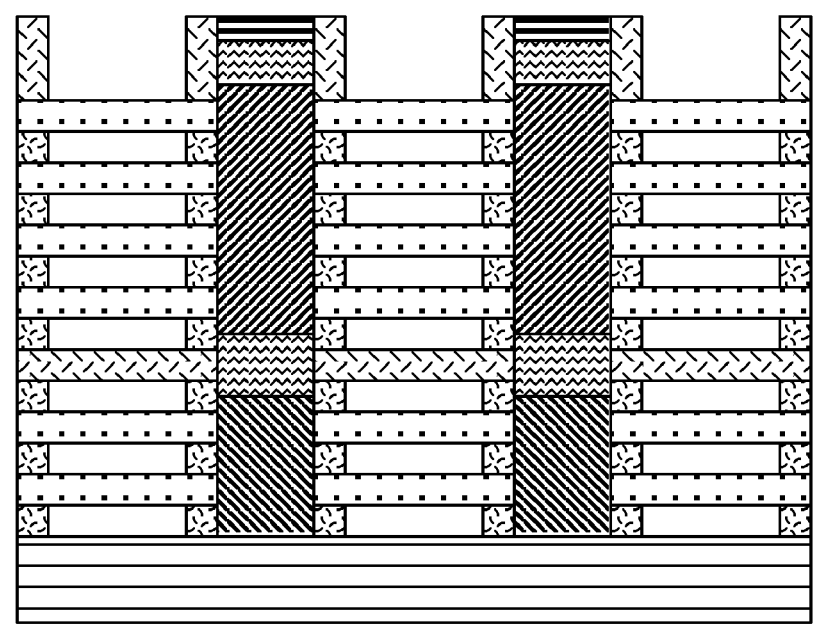
Figure 2A:
Figure 2A:
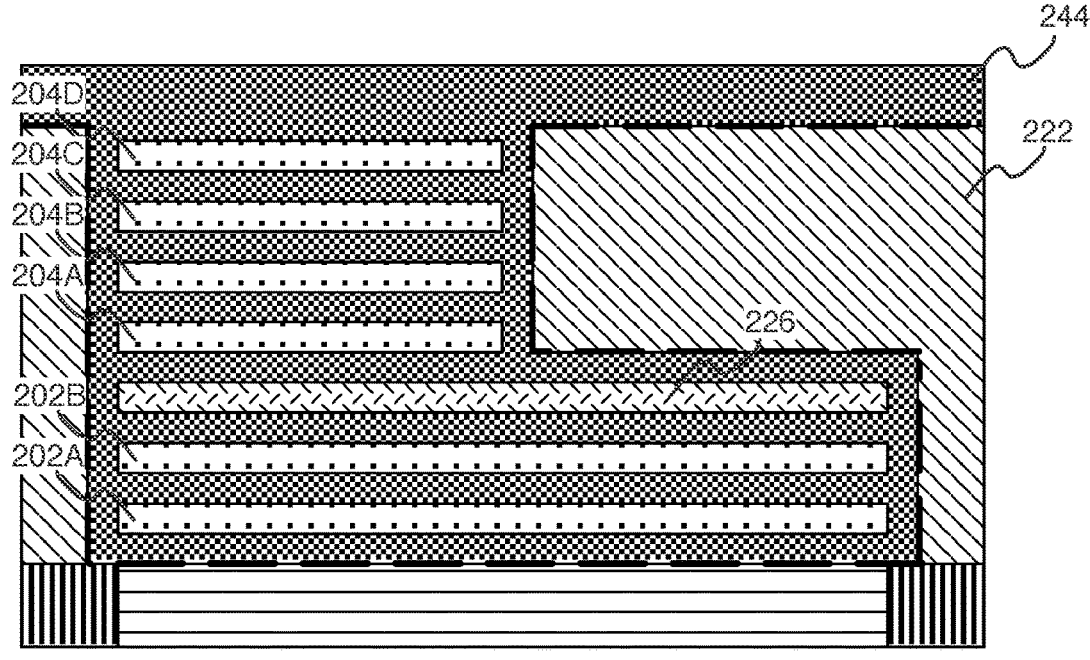
Figure 2B:
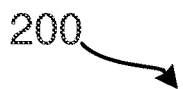
Figure 2B:
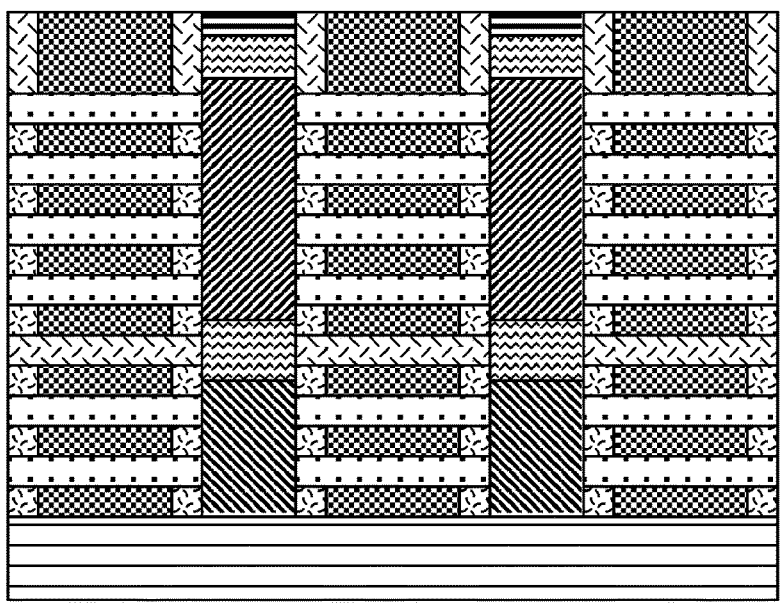
Figure 2C:
Figure 2C:
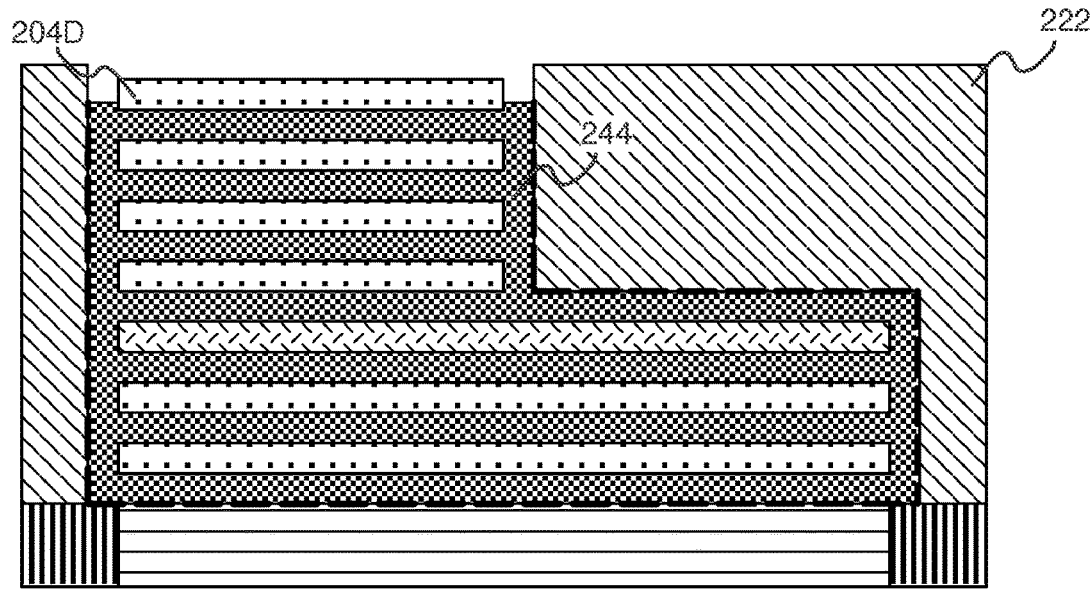
Figure 2D:
Figure 2D:
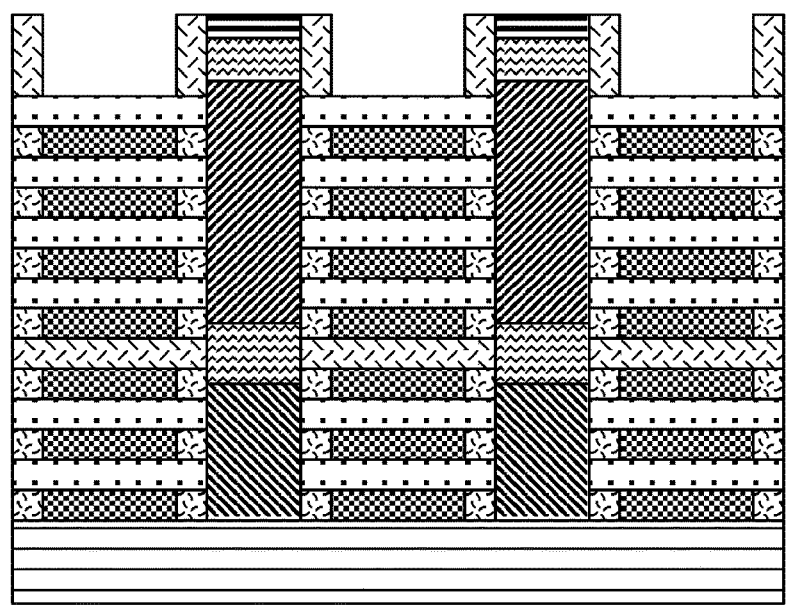
Figure 2E:
Figure 2E:
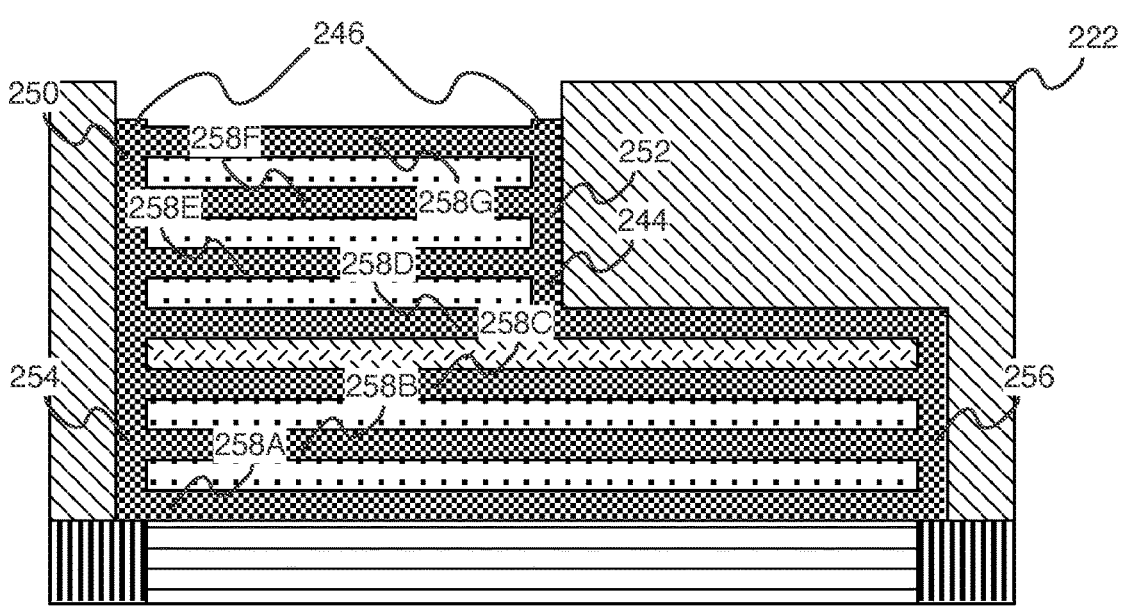
Figure 2F:
Figure 2F:
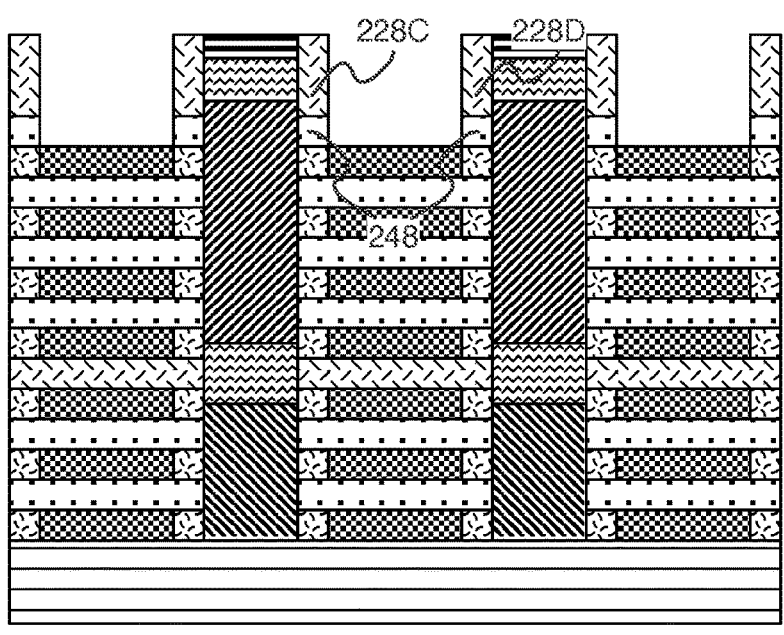
Figure 2G:
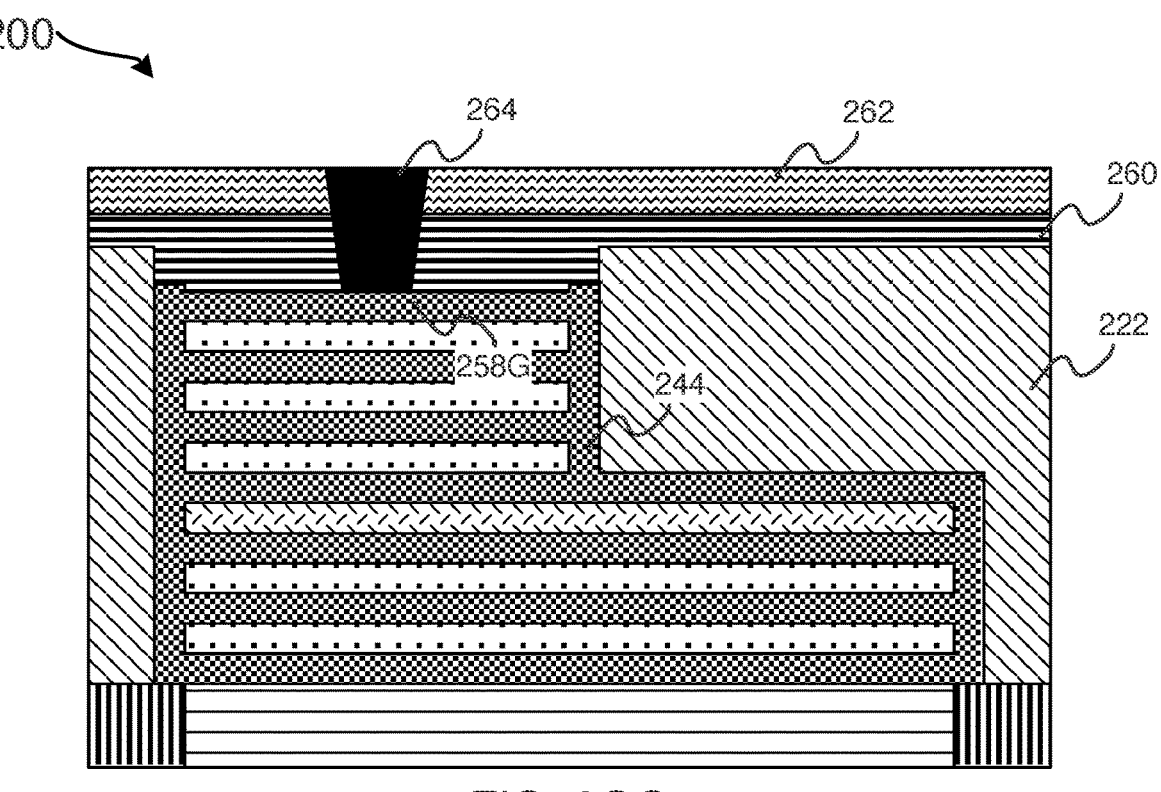
Figure 2H:
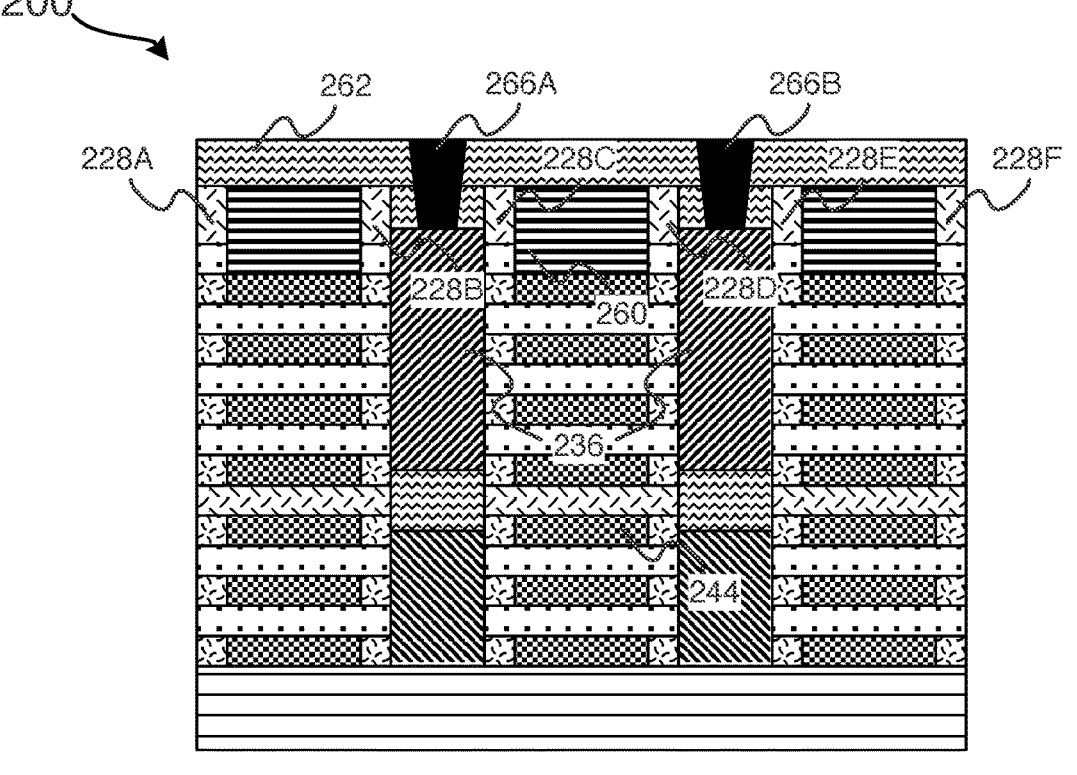

FIGS. 2Y and 2Z represent a thirteenth stage in forming stacked FET structure 200. In this stage, SiGe layers 208 and SiGe layer 220 have all been selectively removed. As noted earlier, in embodiments in which SiGe layers 208 and SiGe layer 220 are composed of the same or nearly the same proportion of germanium, SiGe layers 208 and SiGe layer 220 could be removed simultaneously with the same etchant. After SiGe layers 208 and SiGe layer 220 are removed, the resulting void that is surrounded by dielectric 222 provides a narrow template in which a self-aligned gate can be formed. At the end of this stage, a high-K gate insulator layer (sometimes referred to herein as a "gate insulator" or "insulator liner"), such as hafnium oxide, may be applied to the exposed surface within the resulting void. This liner is illustrated in FIG. 2Y as a dashed line surrounding dielectric 222, nanosheets 202 and 204, and MDI layer 226.

FIGS. 2AA and 2BB illustrate a fourteenth stage in forming stacked FET structure 200. In this stage, gate material 244 has been applied within the void created when SiGe layers 208 and SiGe layer 220 were removed. Gate material 244 includes a gate insulator, such as HfO2, HfLaOx, HfAlOx, etc., as well as gate metals, including work function metals (TiN, TiC, TiAlC, etc.) and optional conductive fill metals, such as tungsten. In some embodiments, work function metals for different devices could be different than what has been described herein. For example, in some devices, a stacked FET structure may utilize a first gate material on bottom FETs and a second gate material on top FETs. For ease of presentation and understanding, the gate insulator layer (such as HfO2) at the interface of gate material 244 and dielectric 222 remains presented in FIG. 2AA, but the liner layer is not reflected around nanosheets 202 or 204 or around MDI layer 226.

FIGS. 2CC and 2DD illustrate a fifteenth stage in forming stacked FET structure 200. In this stage, metal gate material 244 has been recessed to partially above the bottom surface of silicon nanosheet 204D. This recess may use and etchant that is selective to dielectric 222 and silicon nanosheet 204D. In some use cases, recessing gate material 244 may not be a precisely controlled process. As a result, gate material 244 may be recessed to anywhere within a range between the top surface of silicon nanosheet 204D and the bottom surface of silicon nanosheet 204D. As a result of this recess, the liner between gate material 244 and dielectric 222 may also be removed anywhere that gate material 244 is removed.

FIGS. 2EE and 2FF illustrate a sixteenth stage in forming stacked FET structure 200. In this stage, silicon nanosheet 204D has been partially removed using a direction etch. As a result, gate material 246 that was previously slightly above the bottom surface of silicon nanosheet 204D has formed gate bumps 246. Further as a result of the directional etching of nanosheet 204D, the portions of nanosheet 204D that were below spacers 228 have formed sacrificial-channel spacers 248.

At this stage, gate material 244 can also be referred to as gate 244, and the structure of gate 244 can be described in components. Specifically, gate 244 is composed of top FET vertical gate extensions 250 and 252, bottom FET gate extensions 254 and 256, gate sheets 258A, 258B, 258C, 258D, 258E, 258F, and 258G (collectively referred to as gate sheets 258), and gate bumps 246. Because dielectric 222 formed a template that was based on the conformal growth of SiGe layer 220, the gate extensions 250-256 have a relatively uniform thickness. Similarly, because the dimensions of gate sheets 258 were based on the pattern of SiGe layers 208, the thicknesses of gate sheets 258 (the height of gate sheets 258, as illustrated in FIG. 2EE) are relatively uniform. Further, in embodiments in which SiGe layer 220 was grown to be of approximately equal thickness to the thickness (i.e., height) of SiGe layers 208, the thickness of gate sheets 258 should be relatively equal to the thicknesses of gate extensions 250-256. Finally, because gate 244 has been formed with very little, if any, extra metal, (especially within top FET cutout region 218) parasitic capacitance resulting from gate 244 (e.g., from gate 244 to a contact for diffusion region 234) may be minimal.

FIGS. 2GG and 2HH illustrate a seventeenth stage in forming stacked FET structure 200. In this stage, a self-aligned-contact cap 260 has been formed on the top of gate 244 (i.e., on the top of gate sheet 258G and gate bumps 246) and dielectric 222. Self-aligned-contact cap 260 (sometimes referred to as SAC cap 260) may be composed of, for example, SiN. Inter-layer dielectric 262 has also been formed upon SAC cap 260. Inter-layer dielectric could be composed of, for example, silicon dioxide (SiO$_2$).

Gate contact 264 has also been formed through SAC cap 260 and inter-layer dielectric 262. Specifically, gate contact 264 may have been formed by applying a mask to inter-layer dielectric 262, etching a well through SAC cap 260 and inter-layer dielectric 262, and filling the well with contact material (e.g., copper or cobalt). Of note, gate contact 264 may have been feasibly placed further to the left or to the right (as illustrated in FIG. 2GG) as long as it contacted gate sheet 258G.

Diffusion contacts 266A and 266B have been formed to contact diffusion regions 238. Diffusion contacts 266A and 266B may have been formed in a manner similar to gate contact 264. Of note, while diffusion contacts 266A and 266B are depicted as formed directly in the center of diffusion regions 238, in some embodiments the formation of diffusion contacts 266A and 266B may not be as precisely controllable. However, in the embodiment depicted in FIG. 2HH, even if, for example, diffusion contact 266A is placed to the right such that it overlaps with gate 244, SAC cap 260 would prevent it from contacting gate 244.

Of note, in some use cases in which the embodiments of the present disclosure are employed, precise placement of a gate contact over the gate sheets (and nanosheets) of a top FET (e.g., gate sheets 258E-258G nanosheets 204) may be difficult. To address these use cases, some embodiments of the present disclosure are formed with a metal upper gate extension.

Figure 3A:
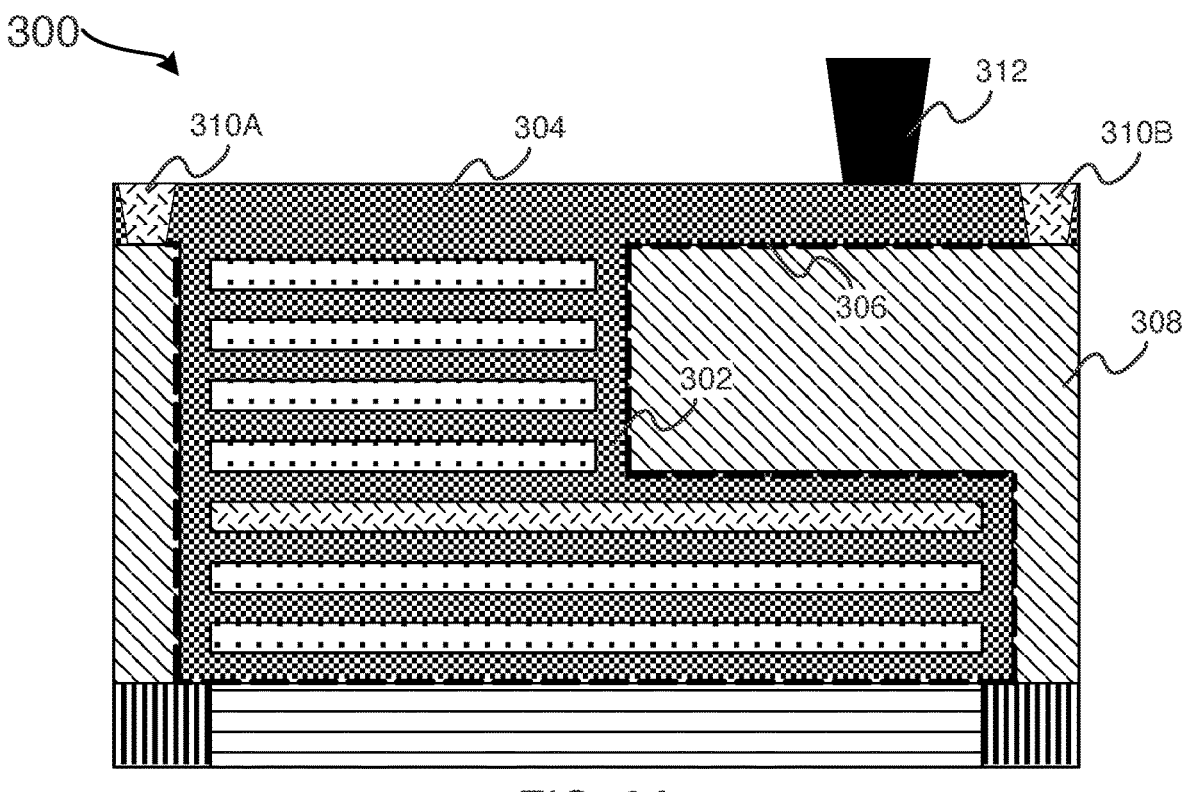
FIGS. 3A and 3B depict a semiconductor cell in a stacked FET design with a self-aligned gate and an upper gate extension, in accordance with embodiments of the present disclosure.
Figure 3B:
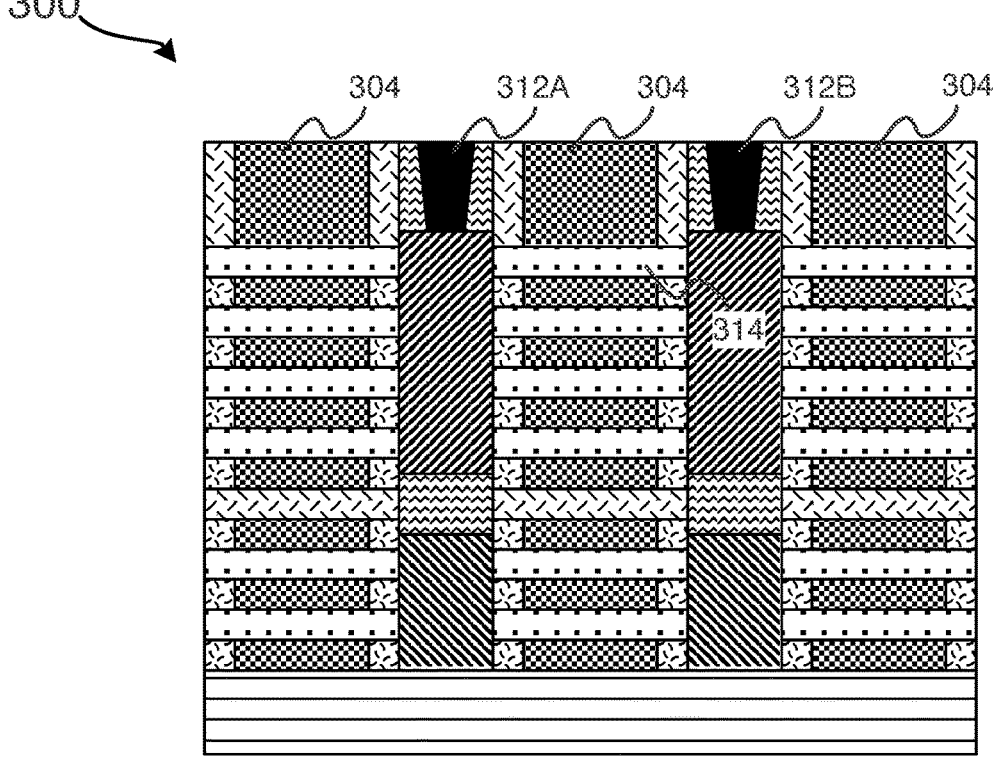

FIGS. 3A-3B, for example, depict a stacked FET structure 300 in which a gate 302 includes an upper gate extension 304. Stacked FET structure 300 could have been formed, for example, in a process similar to stacked FET structure 200 from FIGS. 2A through 2BB. However, rather than recessing gate 302, as gate material 244 was recessed in FIG. 2CC, gate 302 may have simply been planarized to retain upper gate extension 304. As a result, an insulator liner (e.g., hafnium oxide), illustrated in FIG. 3A as dashed line 306, remains on top of dielectric 308.

Of note, because Stacked FET structure 300 includes upper gate extension 304, its top FET does not include a top gate sheet. Further, because upper gate extension 304 is, as illustrated, composed of the same gate material as gate 302, upper gate extension is conductive. Thus, to insulate stacked FET structure 300 from neighboring cells, gate cuts 310A and 310B have been made into upper gate extension 304 and filled with a dielectric material. Also as a result of upper gate extension 304 being an extension of gate 302, gate contact 312 can be placed much more flexibly than in stacked FET structure 200. Specifically, gate contact 312 can be placed upon upper gate extension 304 anywhere between gate cuts 310A and 310B.

Of note, the embodiment illustrated by stacked FET structure 300 does place limitations on diffusion contacts 312A and 312B. Specifically, diffusion contacts 312A and 312B may, if inaccurately placed to the left or right (as illustrated in FIG. 3B), contact upper gate extension 304.

Finally, because gate 302 was not recessed, stacked FET structure 300 retains silicon nanosheet 314, which corresponds to the sacrificial silicon nanosheet 204D in stacked FET structure 300. Thus, the embodiment illustrated by stacked FET structure 300 may be beneficial if a greater number of silicon nanosheets are required in a top FET (e.g., where the ratio of the surface area of each nanosheet in the top FET to the surface area of each nanosheet in the bottom FET is particularly low).

As previously noted, some embodiments of the present disclosure can lead to benefits in the placement scale of multiple stacked semiconductor cells. Particularly, because no gate cut is necessary between gates of adjacent cells, the space between semiconductor cells does not need to account for the imprecise nature of performing gate cuts. Thus, in some use cases, semiconductor cells in accordance with the embodiments of the present disclosure can be placed very closely together.

Figure 4:
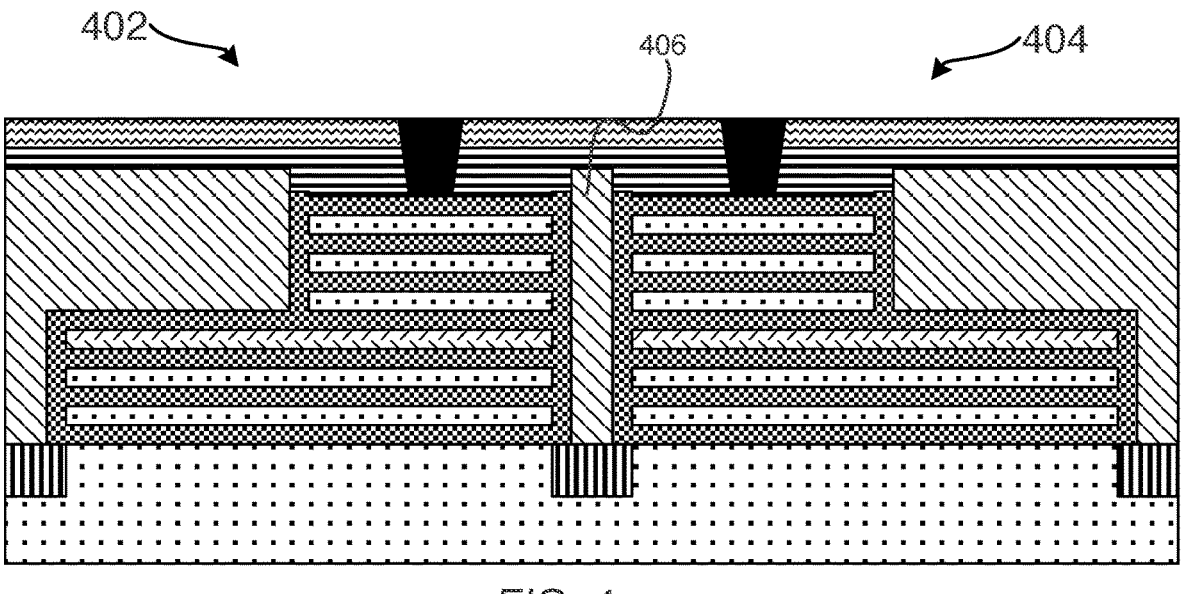
FIG. 4 depicts a set of semiconductor cells with self-aligned gates and self-aligned-contact caps, in accordance with embodiments of the present disclosure.

For example, FIG. 4 depicts a pair of semiconductor cells 402 and 404 that have been formed in accordance with embodiments of the present disclosure. Specifically, semiconductor cells 402 and 404 resemble stacked FET structures 100 and 200, and may have been formed according to stages presented in FIGS. 2A through 2HH. Further, because the space between cells 402 and 404 are defined by the width of dielectric 406, the space between cells 402 and 404 can be very small. This may beneficially allow more compact placement of semiconductor cells that are formed in accordance with the present embodiments on a chip, leading to increased efficiencies in production of the chip and increased chip performance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a top field effect transistor (FET);
a bottom FET, wherein the top FET and bottom FET are in a stacked profile;
a gate, wherein the gate comprises two top-FET gate sidewall extensions and two bottom-FET gate sidewall extensions, wherein the two top-FET gate sidewall extensions each comprise a gate bump;
an insulator liner that interfaces with the two top-FET gate sidewall extensions and two bottom-FET gate sidewall extensions; and
a dielectric that interfaces with the insulator liner.

2. The semiconductor device of claim 1, wherein the gate is self aligned within the dielectric.

3. The semiconductor device of claim 1, wherein the two top-FET gate sidewall extensions and two bottom-FET gate sidewall extensions are of a uniform thickness.

4. The semiconductor device of claim 1, wherein the gate further comprises a set of gate sheets, and wherein the gate sheets are of a uniform thickness.

5. The semiconductor device of claim 4, wherein the gate two top-FET gate sidewall extensions, the two bottom-FET gate sidewall extensions, and the gate sheets are of a uniform thickness.

6. The semiconductor device of claim 1, further comprising a set of sacrificial-channel spacers.

7. The semiconductor device of claim 1, further comprising a self-aligned-contact cap formed upon the gate.

8. A semiconductor device comprising:
a top field effect transistor (FET), wherein the top FET comprises a first sidewall gate extension and a second sidewall gate extension, wherein the first sidewall gate extension and the second sidewall gate extension each comprise a gate bump; and a bottom FET, wherein the bottom FET comprises a third sidewall gate extension and a fourth sidewall gate extension and wherein the top FET and bottom FET are in a stacked profile;
wherein the first, second, third, and fourth sidewall gate extensions are of equal thickness.

9. The semiconductor device of claim 8, wherein the top FET comprises a first set of gate sheets, the bottom FET comprises a second set of gate sheets, and wherein the gate sheets within the first and second set of gate sheets are of equal thickness to the first, second, third, and fourth sidewall gate extensions.

10. The semiconductor device of claim 8, wherein the top FET comprises a bottom gate sheet, wherein a portion of the bottom gate sheet comprises a middle dielectric isolation gate sheet, and wherein the middle dielectric isolation gate sheet is of equal thickness to the first, second, third, and fourth sidewall gate extensions.

11. The semiconductor device of claim 8, further comprising a middle dielectric isolation sheet, wherein the top FET comprises a first set of nanosheets that are of a width that is less than a width of the middle dielectric isolation sheet and wherein the bottom FET comprises a second set of nanosheets that are of a width that is equal to the middle dielectric isolation sheet.

12. The semiconductor device of claim 8, further comprising a set of sacrificial-channel spacers.

13. The semiconductor device of claim 8, further comprising:
an insulator liner that interfaces with the first, second, third, and fourth sidewall gate extensions; and
a dielectric that interfaces with the insulator liner.

14. The semiconductor device of claim 8, further comprising a self-aligned-contact cap.

15. A semiconductor device comprising:
a top field effect transistor (FET), wherein the top FET comprises a first sidewall gate extension and a second sidewall gate extension;
a bottom FET, wherein the bottom FET comprises a third sidewall gate extension and a fourth sidewall gate extension and wherein the top FET and bottom FET are in a stacked profile;
an upper gate extension that connects to the first and second sidewall gate extension, wherein the upper gate extension extends over the bottom FET; and
a first dielectric fill located between the upper gate extension and the bottom FET;
wherein the first, second, third, and fourth sidewall gate extensions are of equal thickness.

16. The semiconductor device of claim 15, wherein the top FET comprises a first set of gate sheets, the bottom FET comprises a second set of gate sheets, and wherein the gate sheets within the first and second set of gate sheets are of equal thickness to the first, second, third, and fourth sidewall gate extensions.

17. The semiconductor device of claim 15, further comprising:
a first dielectric fill that interfaces with the first and third sidewall gate extensions;
a second dielectric fill that interfaces with the second and fourth sidewall gate extensions;
a first gate cut through the upper gate extension, wherein the first gate cut interfaces with the first dielectric fill; and a second gate cut through the upper gate extension, wherein the second gate cut interfaces with the second dielectric fill.

\* \* \* \* \*